(12) United States Patent
Ding et al.

(10) Patent No.: US 11,476,309 B2
(45) Date of Patent: Oct. 18, 2022

(54) DISPLAY PANEL AND METHOD OF MANUFACTURING THE SAME, DISPLAY DEVICE

(71) Applicants: CHENGDU BOE OPTOELECTRONICS TECHNOLOGY CO., LTD., Sichuan (CN); BOE TECHNOLOGY GROUP CO., LTD., Beijing (CN)

(72) Inventors: Wang Ding, Beijing (CN); Chenxing Wan, Beijing (CN); Fuwei Zou, Beijing (CN)

(73) Assignees: CHENGDU BOE OPTOELECTRONICS TECHNOLOGY CO., LTD., Sichuan (CN); BEIJING BOE TECHNOLOGY DEVELOPMENT CO., LTD., Beijing (CN)

( * ) Notice: Subject to any disclaimer, the term of this patent is extended or adjusted under 35 U.S.C. 154(b) by 160 days.

(21) Appl. No.: 16/937,813

(22) Filed: Jul. 24, 2020

(65) Prior Publication Data

US 2021/0028249 A1 Jan. 28, 2021

(30) Foreign Application Priority Data

Jul. 26, 2019 (CN) .......................... 201910680884.2

(51) Int. Cl.
*H01L 27/32* (2006.01)
*H01L 51/56* (2006.01)
(Continued)

(52) U.S. Cl.
CPC ...... *H01L 27/3218* (2013.01); *H01L 27/1288* (2013.01); *H01L 27/3246* (2013.01);
(Continued)

(58) Field of Classification Search
CPC ................... H01L 29/45; H01L 19/458; H01L 51/5237–5259
See application file for complete search history.

(56) References Cited

U.S. PATENT DOCUMENTS 6,894,311 B2 * 5/2005 Maeda ................... H01L 27/124
257/E29.147
9,274,364 B2 * 3/2016 Tanabe .............. G02F 1/133305
(Continued)

FOREIGN PATENT DOCUMENTS

CN 107068720 A 8/2017
CN 108493228 A 9/2018
(Continued)

OTHER PUBLICATIONS

Machine translation, Li, Chinese Pat. Pub. No. CN109802052A, translation date: Oct. 23, 2021, Espacenet, all pages. (Year: 2021).*
(Continued)

*Primary Examiner* — Victoria K. Hall
(74) *Attorney, Agent, or Firm* — McDermott Will & Emery LLP

(57) ABSTRACT

A display panel includes a base, at least one separation pillar, at least one protection pattern, and a light-emitting functional layer. The at least one separation pillar is disposed in the isolation region on the base, each separation pillar is disposed around the opening region, and a longitudinal section of the separation pillar perpendicular to an extending direction of the separation pillar is I-shaped. The at least one protection pattern is disposed on a surface of at least one separation pillar facing away from the base. The light-emitting functional layer is disposed at least in both the pixel region and the isolation region on a surface of the at least one protection pattern facing away from the base, wherein the
(Continued)

light-emitting functional layer is disconnected at an inner side face and an outer side face of the separation pillar.

19 Claims, 16 Drawing Sheets

(51) Int. Cl.
  H01L 51/52 (2006.01)
  H01L 27/12 (2006.01)
  H01L 29/45 (2006.01)
  H01L 29/786 (2006.01)
  H01L 29/417 (2006.01)
  H01L 51/00 (2006.01)

(52) U.S. Cl.
  CPC .... *H01L 27/3258* (2013.01); *H01L 29/41733* (2013.01); *H01L 29/45* (2013.01); *H01L 29/78618* (2013.01); *H01L 51/5237* (2013.01); *H01L 51/5243* (2013.01); *H01L 51/5253* (2013.01); *H01L 51/56* (2013.01); *H01L 51/0097* (2013.01); *H01L 2227/323* (2013.01)

(56) References Cited

U.S. PATENT DOCUMENTS

| | | | |
|---|---|---|---|
| 10,553,819 B2* | 2/2020 | Kim | H01L 27/3244 |
| 11,302,895 B2* | 4/2022 | Zou | H01L 51/525 |
| 2017/0148856 A1* | 5/2017 | Choi | H01L 27/3258 |
| 2018/0039117 A1* | 2/2018 | Ikeda | H01L 27/3232 |
| 2018/0166525 A1* | 6/2018 | Kim | G01N 27/20 |
| 2018/0351127 A1 | 12/2018 | So et al. | |
| 2019/0278399 A1* | 9/2019 | Choi | G06F 3/0446 |
| 2019/0319214 A1* | 10/2019 | Taniyama | H05B 33/22 |
| 2019/0333972 A1* | 10/2019 | Ding | H01L 27/3281 |
| 2019/0334120 A1* | 10/2019 | Seo | H01L 51/5253 |
| 2019/0363276 A1 | 11/2019 | Li et al. | |
| 2020/0006682 A1* | 1/2020 | Seo | H01L 51/56 |
| 2020/0006700 A1* | 1/2020 | Kim | H01L 27/3258 |
| 2020/0006701 A1* | 1/2020 | Lee | H01L 27/3258 |
| 2020/0052054 A1* | 2/2020 | Park | H01L 27/3225 |
| 2020/0083475 A1* | 3/2020 | Kang | H01L 27/3225 |
| 2020/0106045 A1* | 4/2020 | Han | H01L 27/3234 |
| 2020/0119304 A1* | 4/2020 | Choi | H01L 51/5237 |
| 2020/0161582 A1* | 5/2020 | Choi | H01L 27/326 |
| 2020/0176709 A1* | 6/2020 | Moon | G06F 3/0443 |
| 2020/0235333 A1* | 7/2020 | Sung | G06F 1/1686 |
| 2021/0151707 A1* | 5/2021 | Huang | H01L 27/3223 |
| 2021/0234122 A1* | 7/2021 | Choi | H01L 51/0096 |
| 2021/0273194 A1* | 9/2021 | Xie | H01L 51/525 |
| 2021/0336189 A1* | 10/2021 | Li | H01L 51/56 |
| 2021/0343981 A1* | 11/2021 | Xie | H01L 51/5253 |
| 2021/0376288 A1* | 12/2021 | Wang | H01L 27/3258 |
| 2021/0376290 A1* | 12/2021 | Zhang | H01L 27/3262 |
| 2022/0020958 A1* | 1/2022 | Okabe | G09F 9/00 |
| 2022/0045300 A1* | 2/2022 | He | H01L 27/3246 |
| 2022/0052134 A1* | 2/2022 | Zhang | H01L 27/3276 |
| 2022/0093883 A1* | 3/2022 | Jian | H01L 51/0094 |

FOREIGN PATENT DOCUMENTS

| | | | | |
|---|---|---|---|---|
| CN | 108832017 A | | 11/2018 | |
| CN | 109671867 A | | 4/2019 | |
| CN | 109742121 A | | 5/2019 | |
| CN | 109786427 A | | 5/2019 | |
| CN | 109802052 A | * | 5/2019 | H01L 51/52 |
| CN | 109802052 A | | 5/2019 | |
| CN | 109935621 A | * | 6/2019 | H01L 27/32 |
| CN | 109935621 A | | 6/2019 | |
| CN | 110164916 A | * | 8/2019 | H01L 27/32 |
| CN | 110212113 A | * | 9/2019 | H01L 27/3244 |
| CN | 110246984 A | * | 9/2019 | H01L 51/56 |

OTHER PUBLICATIONS

Machine translation, Zhang, Chinese Pat. Pub. No. CN-109935621-A, translation date: Feb. 26, 2022, Clarivate Analytics, all pages. (Year: 2022).*

Machine translation, Zhang, Chinese Pat. Pub. No. CN-110164916-A, translation date: Feb. 26, 2022, Clarivate Analytics, all pages. (Year: 2022).*

Machine translation, Xie, Chinese Pat. Pub. No. CN-110212113-A, translation date: Feb. 26, 2022, Clarivate Analytics, all pages. (Year: 2022).*

Machine translation, Guo, Chinese Pat. Pub. No. CN-110246984-A, translation date: Feb. 26, 2022, Clarivate Analytics, all pages. (Year: 2022).*

First Office Action issued in Chinese Patent Application No. 201910680884.2, dated Mar. 3, 2021; with English translation.

* cited by examiner

DISPLAY PANEL AND METHOD OF MANUFACTURING THE SAME, DISPLAY DEVICE

CROSS-REFERENCE TO RELATED APPLICATION

This application claims priority to Chinese Patent Application No. 201910680884.2, filed on Jul. 26, 2019, which is incorporated herein by reference in its entirety.

TECHNICAL FIELD

The present disclosure relates to the field of display technologies, and in particular, to a display panel and a method of manufacturing the same, and a display device.

BACKGROUND

Display technology based on the organic light-emitting diodes (OLEDs) is a technology of using organic light-emitting materials to achieve light emission and display under driving of current. OLED display devices using the OLEDs have advantages of ultra-light, ultra-thin (a thickness of the OLED display device may be less than 1 mm), high brightness, large viewing angle (up to 170 degrees), self-luminous, low power dissipation, fast response speed, high definition, low heat generation, excellent shock resistance, low manufacturing cost, flexible, etc.

SUMMARY

In one aspect, a display panel is provided. The display panel has a display area. The display area includes a pixel region, an opening region, and an isolation region disposed between the pixel region and the opening region. The isolation region is disposed around the opening region. The display panel includes: a base, at least one separation pillar, at least one protection pattern, and a light-emitting functional layer. The at least one separation pillar is disposed in the isolation region on the base, each separation pillar is disposed around the opening region, and a longitudinal section of the separation pillar perpendicular to an extending direction of the separation pillar is I-shaped. The at least one protection pattern is disposed on a surface of at least one separation pillar facing away from the base. The light-emitting functional layer is disposed at least in both the pixel region and the isolation region on a surface of the at least one protection pattern facing away from the base, and the light-emitting functional layer the light-emitting functional layer is disconnected at an inner side face and an outer side face of the separation pillar.

In some embodiments, an orthographic projection of the separation pillar on the base is within a range of an orthographic projection of a corresponding protection pattern on the base.

In some embodiments, a material of the at least one protection pattern includes an organic resin, and a thickness of each protection pattern is a range of approximately 10 nm to approximately 100 nm.

In some embodiments, in a thickness direction of the base, the separation pillar includes a first separation portion, a second separation portion, and a third separation portion that are sequentially stacked. Compared with the first separation portion and the third separation portion, a side face of the second separation portion proximate to a central axis of the separation pillar is furthest away from the central axis, and a side face of the second separation portion away from the central axis is closest to the central axis. A material of the first separation portion is the same as a material of the third separation portion, and a material of the second separation portion is different from the material of the third separation portion. An etch rate of the material of the second separation portion is greater than an etch rate of the material of the third separation portion.

In some embodiments, the display panel further includes an insulating layer and at least one first groove. The at least one separation pillar is disposed on a first surface of the insulating layer facing away from the base. The least one first groove is disposed in the isolation region in the first surface of the insulating layer, and each first groove is disposed around the opening region. The at least one first groove includes one first groove, the one first groove is disposed on a side of the at least one separation pillar proximate to or away from the opening region, and a side wall of the one first groove proximate to the at least one separation pillar and a side face of a first separation portion of a separation pillar closest to the one first groove are in or substantially in a same plane or a same curved surface. Or, the at least one first groove includes a plurality of first grooves, two first grooves are disposed on both sides of each separation pillar, respectively, and a side wall of each first groove proximate to the separation pillar and a side face of a first separation portion of the separation pillar proximate to the first groove are in or substantially in a same plane or a same curved surface.

In some embodiments, the pixel region includes a plurality of sub-pixel regions; the display panel further includes a plurality of driving circuits disposed between the base and the light-emitting functional layer. Each driving circuit is disposed in a corresponding sub-pixel region. The driving circuit includes a plurality of thin film transistors, each thin film transistor includes a gate, a source and a drain, and the source and the drain are disposed on a side of the gate away from the base. The source and the drain have a three-layer structure. The at least one separation pillar is disposed in same layers as the source and the drain.

In some embodiments, the thin film transistor further includes an active pattern and a portion of the insulating layer located between the gate and the active pattern. The active pattern is disposed on a side of the gate proximate to the base, and the insulating layer is disposed between the gate and both the source and the drain. The source and the drain are in contact with the active pattern through a first via hole and a second via hole passing through at least the insulating layer, respectively. Or, the active pattern is disposed on a side of the gate away from the base, the source and the drain are directly disposed on the active pattern, and the insulating layer is the gate insulating layer.

In some embodiments, the display panel further includes a planarization layer disposed between the driving circuit and the light-emitting functional layer. The planarization layer is disposed in the pixel region. The planarization layer and the at least one protection pattern are disposed in a same layer, and a thickness of the planarization layer is greater than a thickness of each protection pattern.

In some embodiments, the display panel further includes a first barrier and a second barrier that are located in the isolation region and disposed around the opening region. The first barrier and the second barrier are disposed between the at least one separation pillar and the opening region, and the second barrier is disposed between the first barrier and the opening region. In the thickness direction of the base, a distance from a surface of the first barrier facing away from the base to a surface of the base facing the first barrier is less than a distance from a surface of the second barrier facing away from the base to the surface of the base.

In some embodiments, the display panel further includes: a raised portion disposed on a surface of the second barrier proximate to the base, and a pixel defining structure disposed in the pixel region and located between adjacent sub-pixel regions. The first barrier, the second barrier and the pixel defining structure are disposed in a same layer, and the raised portion and the at least one protection pattern are disposed in a same layer.

In some embodiments, at least one second groove is disposed in the isolation region in the first surface of the insulating layer. The at least one second groove is disposed between the second barrier and the opening region.

In some embodiments, the at least one separation pillar includes two separation pillar spaced apart.

In some embodiments, the display panel further includes a cathode disposed on a surface of the light-emitting functional layer facing away from the base. The cathode is located at least in both the pixel region and the isolation region, and is disconnected at the inner side face and the outer side face of the separation pillar.

In another aspect, a display apparatus is provided. The display apparatus includes the display panel described in any of the foregoing embodiments.

In yet another aspect, a method of manufacturing the display panel described in some of the foregoing embodiments. The method includes: forming at least one separation pillar transition structure in the isolation region on the base through a dry etching process, each separation pillar transition structure being arranged around the opening region; forming the at least one protection pattern on surface of at least one separation pillar transition structure; performing a wet etching on the at least one separation pillar on which the at least one protection pattern has been formed to form the separation pillar, and the longitudinal section of the separation pillar being I-shaped; forming the light-emitting functional layer at least in both the pixel region and the isolation region on which the at least one separation pillar has been formed, and the light-emitting functional layer being disconnected at the inner side face and the outer side face of the separation pillar.

In some embodiments, forming the at least one separation pillar transition structure in the isolation region on the base through the dry etching process includes: forming a first separation film, a second separation film and a third separation film sequentially on the base, a material of the first separation film being the same as a material of the third separation film, a material of the second separation film being different from the material of the third separation film, and an etch rate of the material of the third separation film being less than an etch rate of the material of the second separation film; etching the first separation film, the second separation film, and the third separation film through the dry etching process to form the at least one separation pillar transition structure in the isolation region. Each separation pillar transition structure includes a first separation pattern, a second separation pattern, and a third separation pattern.

In some embodiments, before forming the at least one separation pillar transition structure in the isolation region on the base through the dry etching process, the method further includes: forming an insulating layer on the base; forming at least one first groove in the isolation region in the insulating layer, each first groove being disposed around the opening region. Each separation pillar transition structure is formed on a side of a first groove proximate to or facing away from the opening region, and a side face of the first groove proximate to the separation pillar transition structure and a side face of the separation pillar transition structure proximate to the first groove are in or substantially in a same plane or a same curved surface. Or, each separation pillar transition structure is formed between two adjacent first grooves, and a side face of each first groove proximate to the separation pillar transition structure and a side face of the separation pillar transition structure proximate to the first groove are in or substantially in a same plane or a same curved surface.

In some embodiments, the pixel region includes a plurality of sub-pixel regions. Before forming the light-emitting function layer at least in both the pixel region and the isolation region on the base on which the at least one separation pillar has been formed, the method further includes: forming a driving circuit located in each sub-pixel region on the base. The driving circuit includes a plurality of thin film transistors. Each thin film transistor includes a gate, a source, and a drain, and the source and the drain are disposed on a side of the gate away from the base. The source and the drain have a three-layer structure, and the at least one separation pillar transition structure is formed through a same patterning process as the source and the drain.

In some embodiments, forming a driving circuit in each sub-pixel region on the base includes: forming an active pattern, a gate insulating block and a gate on the base, an area of an orthographic projection of the gate insulating block on the base being less than an area of an orthographic projection of the active pattern on the base; forming an interlayer insulating layer on the gate, the interlayer insulating layer having a first via and a second via passing therethrough to expose a portion of the active pattern; forming a first separation film, a second separation film, and a third separation film sequentially on the interlayer insulating layer, the first separation film, the second separation film, and the third separation film being located in both the pixel region and the isolation region; performing a dry etching on the first separation film, the second separation film, and the third separation film to form the source and the drain in the pixel region, the source and the drain being in contact with the active pattern through the first via hole and the second via hole, respectively.

In some embodiments, forming the at least one protection pattern on the surface of the at least one separation pillar transition structure facing away from the base includes: forming a planarization layer film at least both in the pixel region and in the isolation region on the surface of the separation pillar transition structure facing away from the base; etching the planarization layer film with a half-tone mask to form a planarization layer in the pixel region and the at least one protection pattern in the isolation region. A thickness of the planarization layer is greater than a thickness of each protection pattern.

BRIEF DESCRIPTION OF THE DRAWINGS

In order to describe technical solutions in embodiments of the present disclosure more clearly, the accompanying drawings to be used in description of embodiments will be introduced briefly. However, the accompanying drawings to be described below are merely some embodiments of the present disclosure, and a person of ordinary skill in the art can obtain other drawings according to these drawings without paying any creative effort.

DETAILED DESCRIPTION

The technical solutions in embodiments of the present disclosure will be described clearly and completely with reference to the accompanying drawings in the embodiments of the present disclosure. However, the described embodiments are merely some but not all of the embodiments of the present disclosure. All other embodiments made on the basis of the embodiments of the present disclosure by a person of ordinary skill in the art without paying any creative effort shall be included in the protection scope of the present disclosure.

Unless the context requires otherwise, the term "comprise" and other forms thereof such as the third-person singular form "comprises" and the present participle form "comprising" throughout the specification and the claims are construed as open and inclusive meaning, i.e., "included, but not limited to." In the description of the specification, terms such as "one embodiment", "some embodiments", and "exemplary embodiments", "example", and "specific example" or "some examples" and the like are intended to indicate that specific features, structures, materials or characteristics related to the embodiment(s) or example(s) are included in at least one embodiment or example of the present disclosure. Schematic expression of the above terms do not necessarily refer to same embodiment(s) or example (s). In addition, the specific features, structures, materials or characteristics may be included in any one or more embodiments or examples in any suitable manner.

Words such as "first" and "second" are only used for descriptive purposes and are not to be construed as indicating or implying relative importance or implicitly indicating the number of indicated technical features below. Thus, features defined by the words "first" and "second" may explicitly or implicitly include one or more of the features. In the description of the embodiments of the present disclosure, both the terms "a plurality of" and "the plurality of" mean two or more unless otherwise specified.

It will also be understood that when a layer or element is referred to as being "on" another layer or substrate, it can be directly on the other layer or substrate, or intervening layers may also be present.

"Approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system).

The expression "A and/or B" includes the following three combinations: only A, only B, and a combination of A and B.

In order to meet consumers' demands for full-screen display devices with narrow bezel, functional components such as a front camera, a face recognition sensor, a light sensor or an earpiece may be disposed in a display area of a display panel of the display device.

Figure 1:
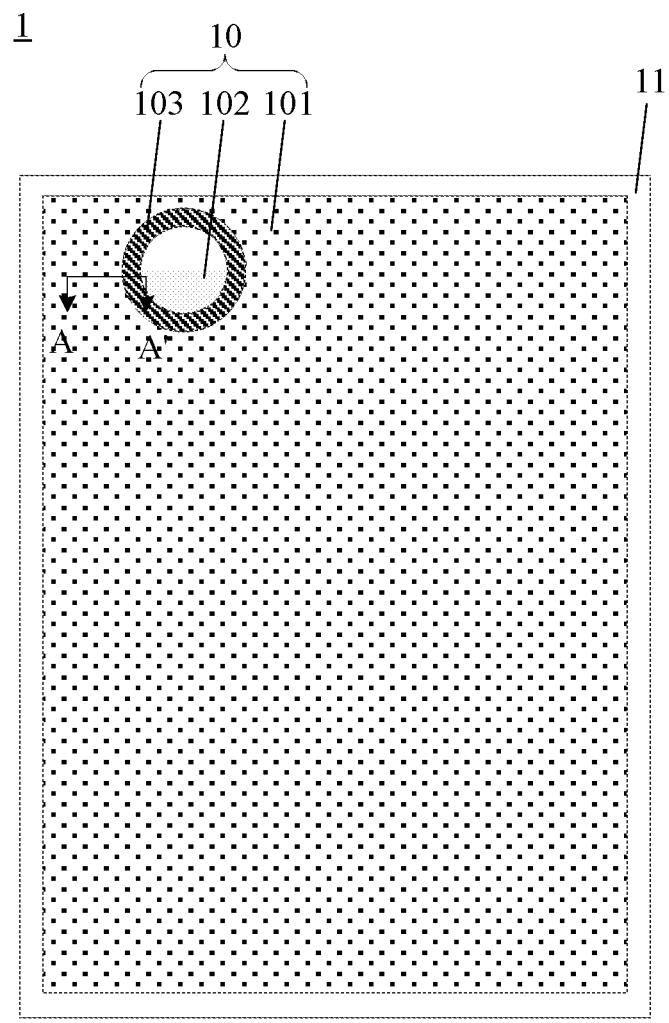
FIG. 1 is a top view of a display panel, according to some embodiments.
Figure 2A:
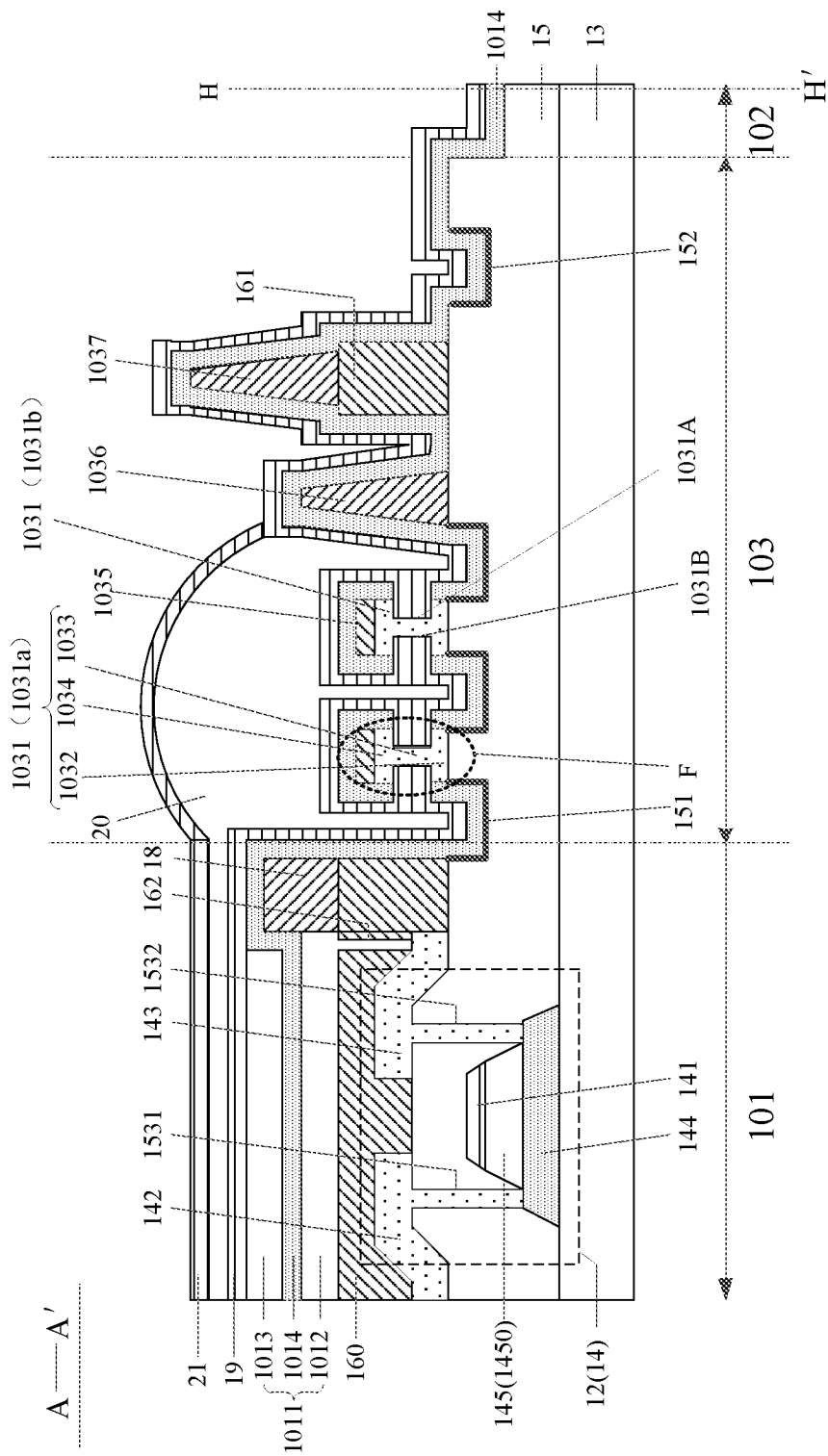
FIG. 2A is a cross-sectional diagram of the display panel taken in direction A-A' in FIG. 1.
Figure 2B:
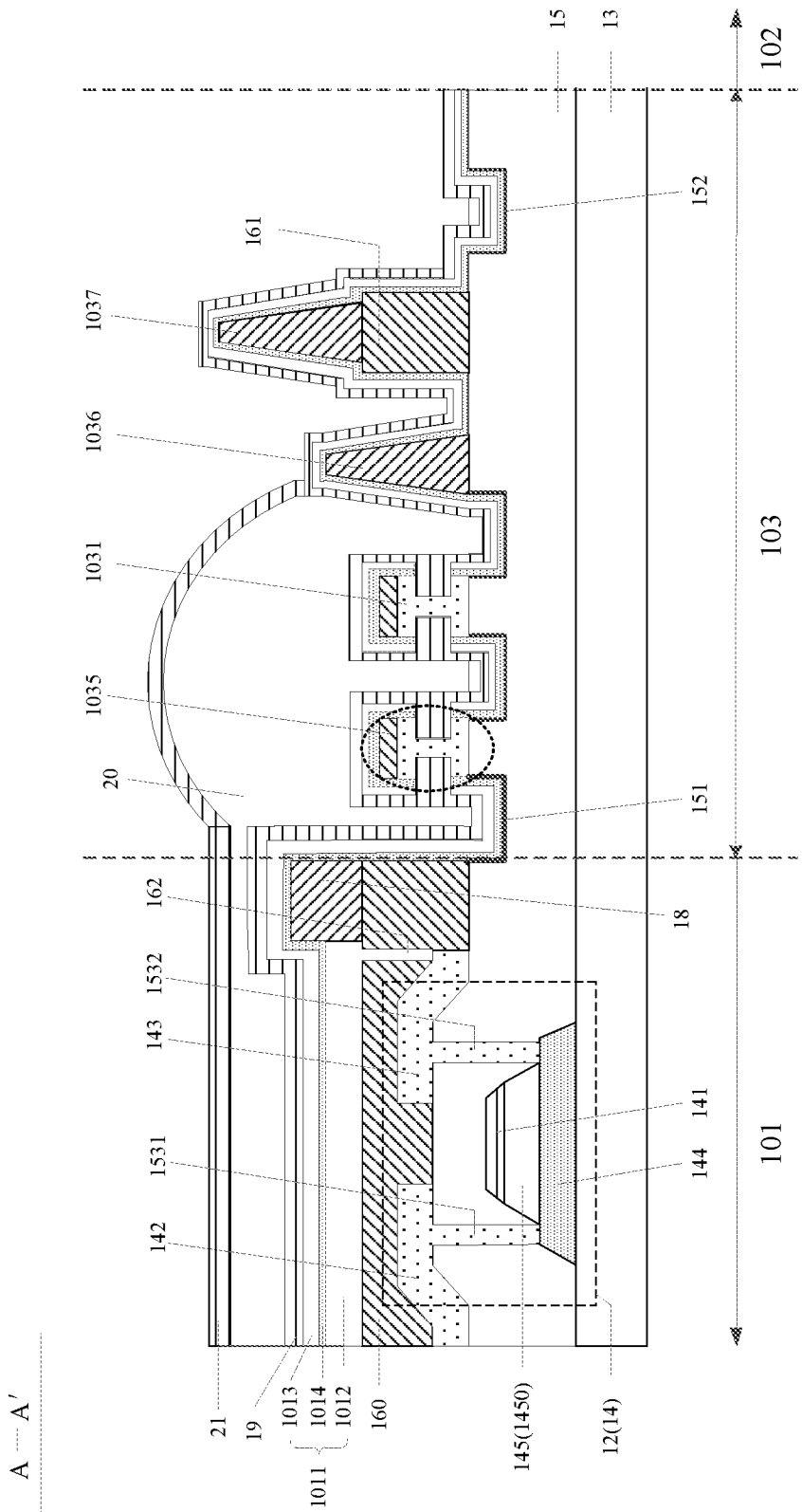
FIG. 2B is another cross-sectional diagram of the display panel taken in direction A-A' in FIG. 1.
Figure 2C:
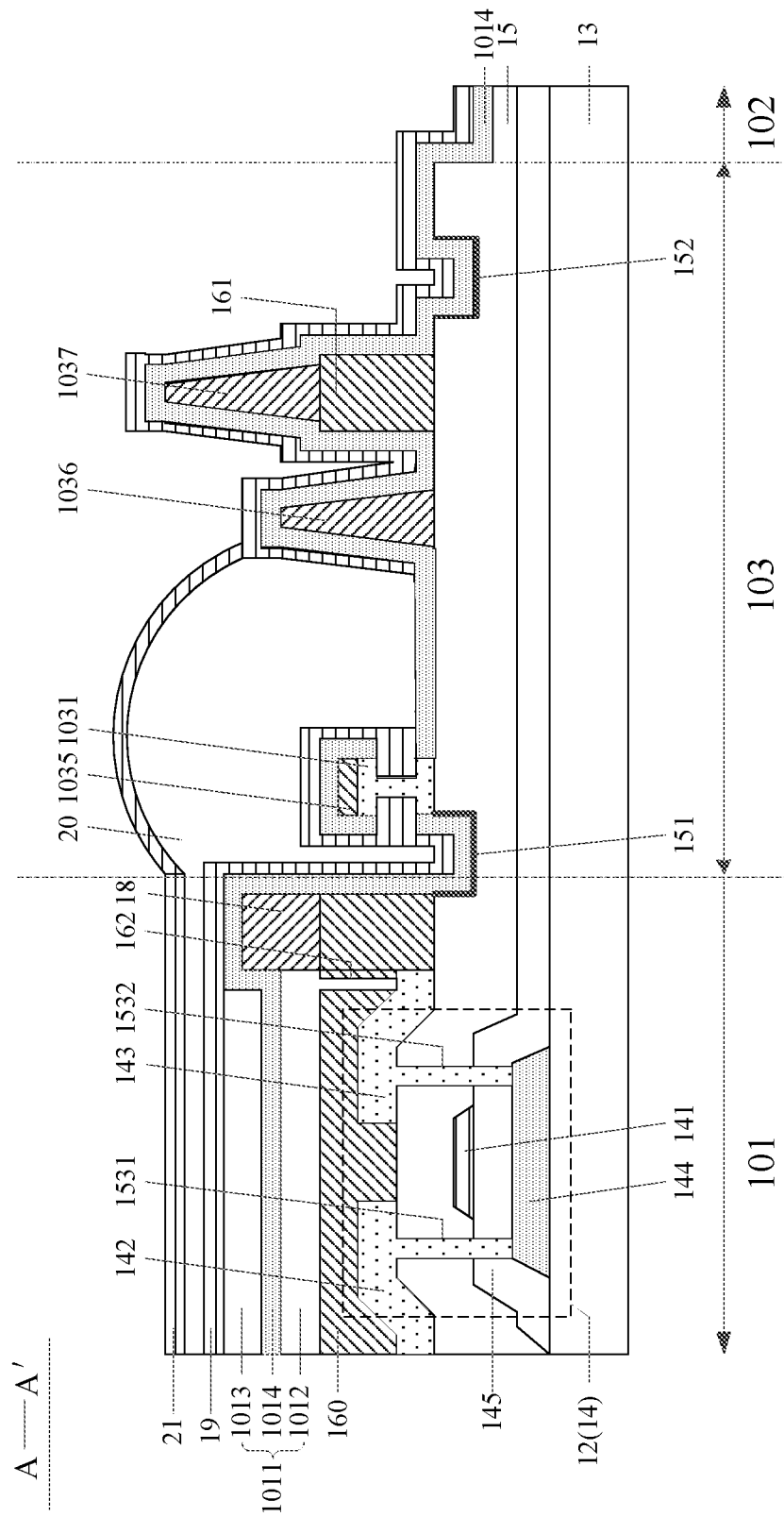
FIG. 2C is yet another cross-sectional diagram of the display panel taken in direction A-A' in FIG. 1.
Figure 2D:
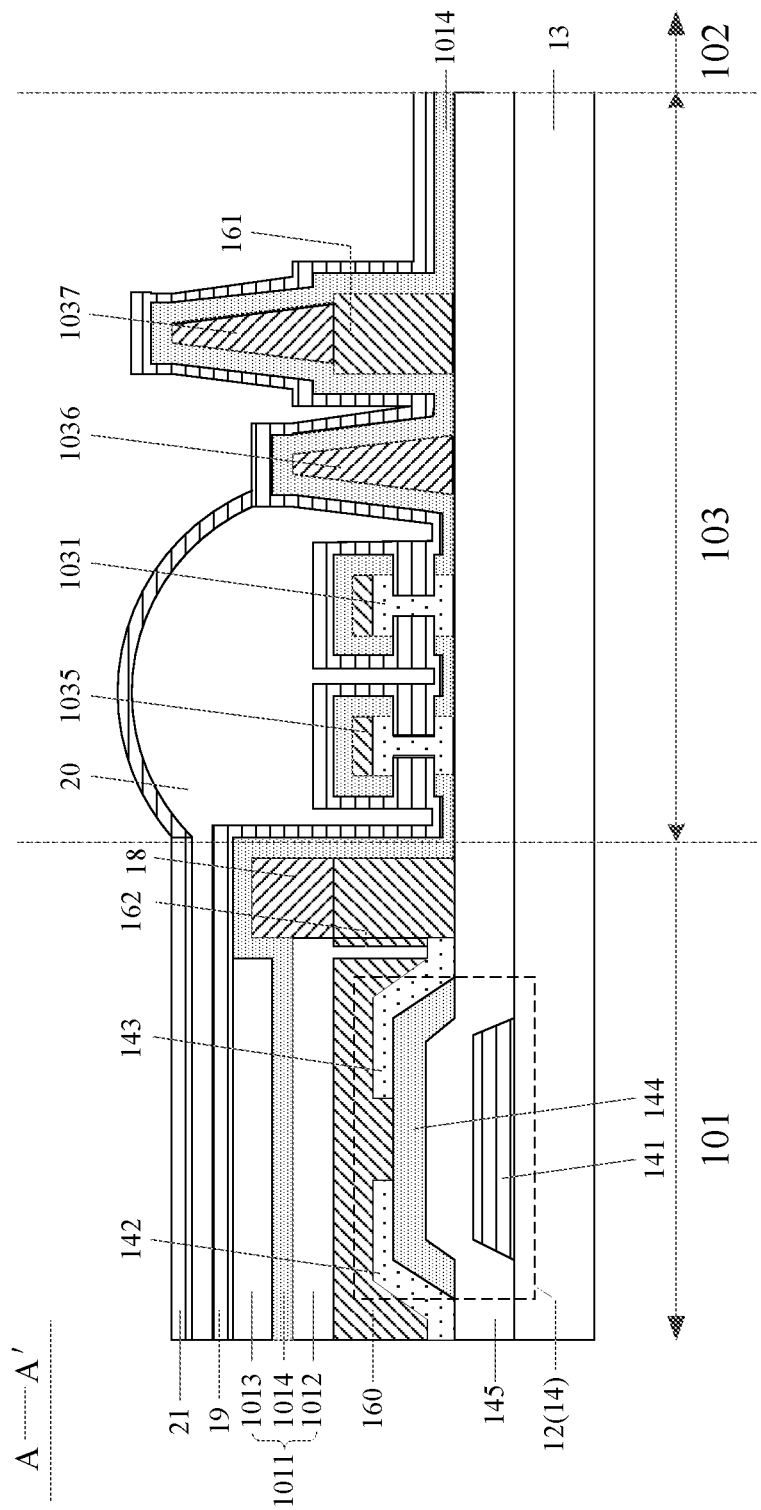
FIG. 2D is yet another cross-sectional diagram of the display panel taken in direction A-A' in FIG. 1.

Some embodiments of the present disclosure provide a display panel. As shown in FIGS. 1 to 2D, the display panel 1 has a display area 10. The display area 10 includes a pixel region 101, an opening region 102, and an isolation region 103 located between the pixel region 101 and the opening region 102. The isolation region 103 is disposed around the opening region 102.

Herein, the pixel region 101 is used for displaying images, and the opening region 102 is used for installing functional components. The functional components include at least one of the front camera, the face recognition sensor, the light sensor, or the earpiece. The isolation region 103 is used to obstruct water vapor and oxygen, so as to prevent the water vapor and the oxygen from entering the pixel region 101 through the opening region 102.

Figure 3A:
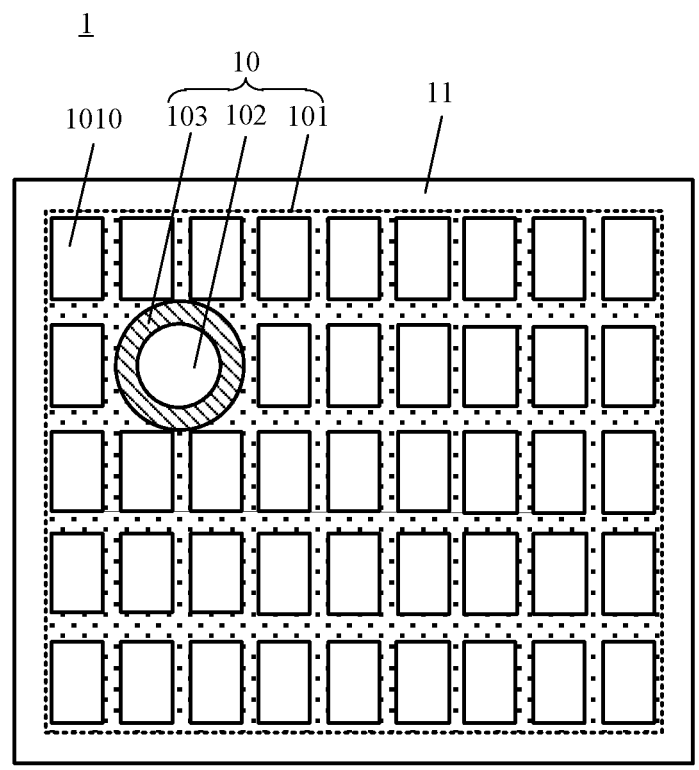
FIG. 3A is a top view of a display panel, according to some embodiments.
Figure 3B:
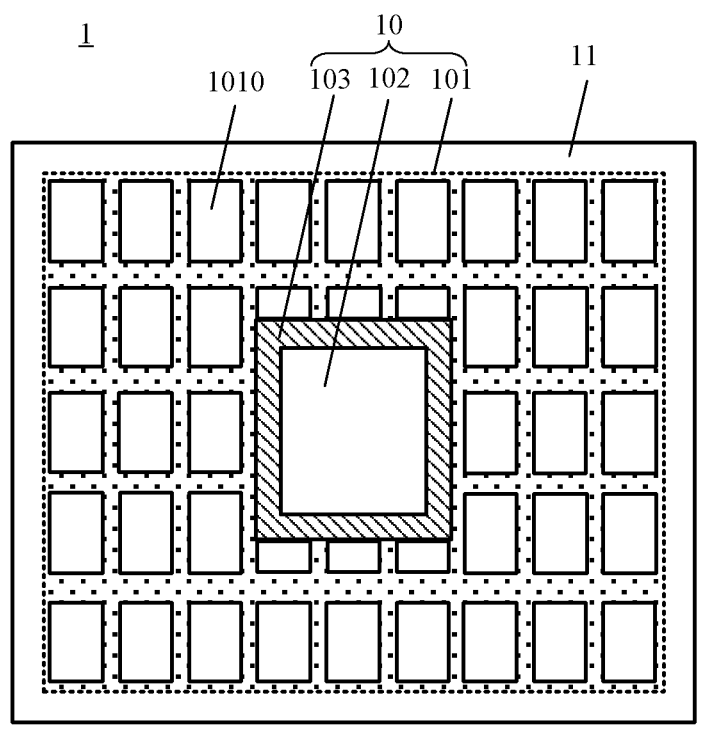
FIG. 3B is a top view of another display panel, according to some embodiments.

In some examples, the opening region 102 may be in a shape of a circle, an ellipse, or a polygon, such as a square, a rectangle, a pentagon or a hexagon. The isolation region 103 may be in a shape of a ring matching with the shape of the opening region 102, for example, may be a circular ring matching with the circle, an elliptical ring matching with the ellipse, or a polygonal ring matching with the polygon, such as a square ring, a rectangular ring, a pentagonal ring or a hexagonal ring. FIG. 3A shows an example where the opening region 102 is in the shape of the circle and the isolation region 103 is in the shape of the circular ring. FIG. 3B shows another example where the opening region 102 is in the shape of the rectangle and the isolation region 103 is in the shape of the rectangular ring.

Of course, the shape of the opening region 102 may also be other regular shapes. The shape of the isolation region 103 may be determined according to the shape of the opening region 102. Herein, as shown in FIG. 1, the shape of the isolation region 103 is a shape of a region defined by both an edge of the opening region 102 and an inner edge of the pixel region 101.

It will be noted that, an opening may be formed in the opening region 102 of the display panel 1 after the display panel 1 is formed or during a process of assembling the display panel 1 into a display device. In this case, as shown in FIGS. 2A and 2C, before the opening is formed, the display panel 1 includes a base 13, and the base 13 includes a portion located in the pixel region 101 and the isolation region 103, and a portion located in the opening region 102. On this basis, in a process of forming the display panel 1, some insulating layers include both a portion located in the pixel region 101 and the isolation region 103 and a portion located in the opening region 102. Of course, an opening may also be formed in a portion of the base 13 disposed in the opening region 102 before the display panel 1 is formed, and then other layers are formed on the base 13. On this basis, as shown in FIGS. 2B and 2D, after the display panel 1 is manufactured, there is no layer in the opening region 102.

In some embodiments, as shown in FIG. 1, the display panel 1 further has a peripheral area 11 located in the periphery of the display area 10. The peripheral area 11 is used for wiring. In some examples, the peripheral area 11 is disposed around the display area 10. In some other examples, the peripheral area 11 is not located on all sides of the display area 10. For example, the peripheral area 11 is located on two opposite sides of the display area 10. FIG. 1 shows the example in which the peripheral area 11 is disposed around the display area 10, but the embodiments of the present disclosure are not limited thereto.

As shown in FIGS. 2A to 2D, the display panel 1 further includes at least one separation pillar 1031, at least one protection pattern 1035 and a light-emitting function layer 1014. The at least one separation pillar 1031 is disposed in the isolation region 103 on the base 13. The at least one protection pattern 1035 is disposed on a surface of at least one separation pillar 1031 facing away from the base 13. For example, the at least one protection pattern 1035 includes one protection pattern 1035, and the protection pattern 1035 is disposed on a surface of one of the at least one separation pillar 1031 facing away from the base 13. For another example, the at least one protection pattern 1035 includes a plurality of protection patterns 1035, the at least one separation pillar 1031 includes a plurality of separation pillars 1031, and some of the plurality of protection patterns 1035 are each disposed on a surface of a corresponding separation pillar 1031 facing away from the base 13. For another example, the at least one protection pattern 1035 includes a plurality of protection patterns 1035, the at least one separation pillar 1031 includes a plurality of separation pillars 1031, and each protection pattern 1035 is disposed on a surface of a corresponding separation pillar 1031 facing away from the base 13. The light-emitting functional layer 1014 is disposed on a surface of the at least one protection pattern 1035 facing away from the base 13, and is located at least in both the pixel region 101 and the isolation region 103.

As shown in FIGS. 2A to 2D, and 5, the separation pillar 1031 is in a shape of a ring and is disposed around the opening region 102. Similar to the isolation region 103, the shape of the separation pillar 1031 may be determined according to the shape of the opening region 102, and may be matched with the shape of the opening region 102. For example, when the shape of the opening region 102 is a circle, the shape of the separation pillar 1031 may be a circular ring. For another example, when the shape of the opening region 102 is a polygon, the shape of the separation pillar 1031 may be a polygonal ring. For yet another example, when the shape of the opening region 102 is an ellipse, the shape of the separation pillar 1031 may be an elliptical ring.

Figure 5:
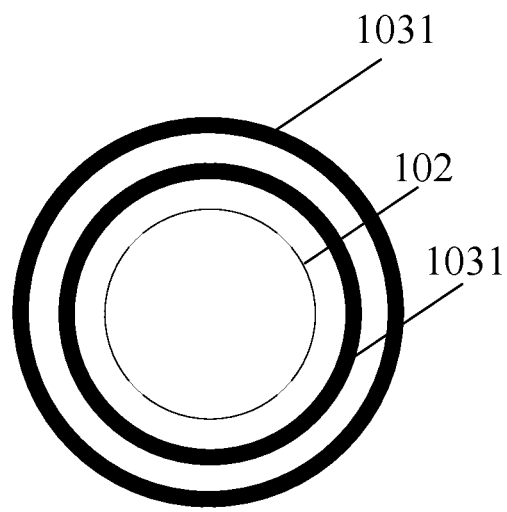
FIG. 5 is a top view of a separation pillar, according to some embodiments.

As shown in FIGS. 2A to 2D, and 6A, the separation pillar 2031 extends along the isolation region 103, and the longitudinal section of the separation pillar 1031 perpendicular to the extending direction of the separation pillar 1031 is I-shaped. For example, as shown in FIG. 1, the shape of the separation pillar 1031 is a circular ring, and the longitudinal section of the separation pillar 1031 is a section along the diameter of the circular ring that passes through the center of the separation pillar 1031. The I-shaped may mean that the shape of the longitudinal section of the separation pillar 1031 is a shape that is wide in upper and lower portions and is narrow in middle portion. In this case, as shown in FIGS. 2A and 5, the inner side face 1031A and the outer side face 1031B of the middle portion of the separation pillar 1031 are not covered with the light-emitting functional layer 1014, which means that the light-emitting functional layer 1014 is disconnected at side faces of the separation pillar 1031. As shown in FIG. 2A, the inner side face 1031A of the middle portion of the separation pillar 1031 refers to the side face of the middle portion proximate to the central axis HH' of the separation pillar 1031, and the outer side face 1031B thereof refers to the side face of the middle portion facing away from the central axis HH' of the separation pillar 1031.

In the display panel 1, the separation pillar 1031 is disposed in the isolation region 103 and is disposed around the opening region 102, and the longitudinal section of the separation pillar 1031 is I-shaped, which makes the light-emitting functional layer 1014 disconnect at the side faces of the separation pillar 1031 in a subsequent process of forming the light-emitting device 1011. Since the light-emitting functional layer 1014 is disconnected in the isolation region 103, water vapor and oxygen entering part of the light-emitting functional layer 1014 located in the isolation region 103 from the opening region 102 cannot continue spreading to the pixel region 101, which plays a role of obstructing water vapor and oxygen.

It will be noted that, the at least one separation pillar 1031 may include one separation pillar 1031 or a plurality of separation pillars 1031, such as two or more separation pillars 1031, and the number of the at least one separation pillar 1031 may be set according to actual needs. The at least one protection pattern 1035 may include one protection pattern 1035 or a plurality of protection patterns 1035, such as two or more protection patterns 1035, and each protection pattern 1035 covers the surface of a corresponding separation pillar 1031. Drawings herein show examples in which the at least one separation pillar 1031 includes one or two separation pillars 1031 and the surface of each separation pillars 1031 facing away the base 13 is covered with one protection pattern 1035, but the number of the at least one separation pillar 1031 and the protection pattern 1035 in the embodiments are not limited thereto, and may be three, four, etc.

In addition, the protection pattern 1035 is disposed on the surface of the separation pillar 1031 facing away from the base 13. In this case, in a manufacturing process, before etching and forming the I-shaped separation pillar 1031, the protection pattern 1035 may be formed on the separation pillar 1031 to be formed. Then, the films under the protection pattern 1035 are etched to form the separation pillar 1031. On the one hand, since the protection pattern 1035 may protect the lower film with which the protection pattern 1035 is in contact, it may be possible to avoid a problem of narrow top portion of the separation pillar 1031 due to a fast etching speed of an etching solution, thereby facilitating the formation of the I-shaped separation pillar 1031; on the other hand, even if the top portion of the separation pillar 1031 becomes narrow due to an influence of the etching solution, since the protection pattern 1035 formed previously is not affected by the etching solution, an area of the protection pattern 1035 does not change before and after etching, which may ensure that an overall structure of the separation pillar 1031 and the protection pattern 1035 is still I-shaped, and the light-emitting functional layer may still be disconnected at the side faces of the separation pillar 1031.

In some embodiments, as shown in FIGS. 3A and 3B, the pixel region 101 includes a plurality of sub-pixel regions 1010. In the display panel 1, the sub-pixel region 1010 is provided with a sub-pixel therein. The sub-pixel may be a first color sub-pixel, a second color sub-pixel, or a third color sub-pixel. For example, the first color sub-pixel, the second color sub-pixel, and the third color sub-pixel are a red sub-pixel, a green sub-pixel and a blue sub-pixel, respectively.

As shown in FIGS. 2A to 2D, the display panel 1 further includes a plurality of anodes 1012 disposed on a surface of the light-emitting functional layer 1014 proximate to the base 13, and one cathode 1013 disposed on a surface of the light-emitting functional layer 1014 facing away from the base 13. The plurality of anodes 1012 are disposed in the plurality of sub-pixel regions 1010 in one-to-one correspondence. The cathode 1013 may be an integrated structure and covers all sub-pixel regions 1010. A portion of the light-emitting functional layer 1014 located in each sub-pixel region 1010, a portion of the cathode 1013 located in the sub-pixel region 1010, and the anode 1012 located in the sub-pixel region 1010 constitute a light-emitting device 1011.

Figure 4:
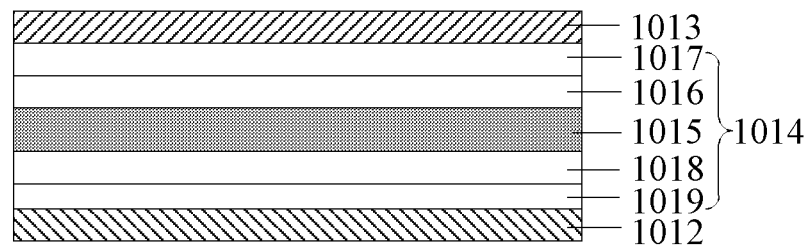
FIG. 4 is a schematic diagram of a light-emitting device, according to some embodiments.

For example, as shown in FIG. 4, the light-emitting functional layer 1014 includes a light-emitting layer 1015, a hole injection layer (HIL) 1019, a hole transport layer (HTL) 1018, an electron injection layer (EIL) 1017, and an electron transport layer (ETL) 1016. The HIL 1019 is disposed between the light-emitting layer 1015 and the plurality of anodes 1012. The HTL 1018 is disposed between the light-emitting layer 1015 and the HIL 1019. The EIL 1017 is disposed between the light-emitting layer 1015 and the cathode 1013. The ETL 1016 is disposed between the light-emitting layer 1015 and the EIL 1017.

In some embodiments, each layer in the light-emitting functional layer 1014 covering all sub-pixel regions 1010 has an integrated structure. For example, the light-emitting functional layer 1014 includes the HIL 1019, the HTL 1018, the light-emitting layer 1015, the ETL 1016, and the EIL 1017 that are sequentially stacked in a thickness direction of the base 13; the HIL 1019 covers all the sub-pixel regions 1010, that is, the HIL 1019 of all the light-emitting devices 1011 has an integrated structure; the HTL 1018 covers all the sub-pixel regions 1010, that is, the HTL 1018 of all the light-emitting devices 1011 has an integrated structure; the light-emitting layer 1015 covers all the sub-pixel regions 1010, that is, the light-emitting layer 1015 of all the light-emitting devices 1011 has an integrated structure; the ETL 1016 covers all the sub-pixel regions 1010, that is, the ETL 1016 of all the light-emitting devices 1011 has an integrated structure; the EIL 1017 covers all the sub-pixel regions 1010, that is, the EIL 1017 of all the light-emitting devices 1011 has an integrated structure. In this case, the display panel 1 further includes a filter unit disposed in each sub-pixel region 1010. For example, in a case where the light-emitting layer 1015 emits white light and the sub-pixel regions include red sub-pixels, green sub-pixels and blue sub-pixels, a filter unit of the red sub-pixel is used to filter out light of other wavelengths except red light, a filter unit of the green sub-pixel is used to filter out light of other wavelengths except green light, a filter unit in the blue sub-pixel is used to filter out light of other wavelengths except blue light.

In some other embodiments, the light-emitting functional layer 1014 includes a plurality of light-emitting layers 1015 spaced apart from each other. Each of remaining layers of the light-emitting functional layer 1014 except the light-emitting layers 1015 has an integrated structure. The light-emitting layer 1015 of the red sub-pixel is used to emit red light. The light-emitting layer 1015 of the green sub-pixel is used to emit green light. The light-emitting layer 1015 of the blue sub-pixel is used to emit blue light.

In some embodiments, as shown in FIG. 2B, the cathode 1013 is located at least in the pixel region 101 and the isolation region 103. The cathode 1013 does not cover the inner side face and the outer side face of the separation pillar 1031, that is, the cathode 1013 is also disconnected at side faces of the separation pillar 1031.

Since both the light-emitting functional layer 1014 and the cathode 1013 are disconnected in the isolation region 103, it is possible to prevent water vapor and oxygen that enter the display panel 1 from the opening region 102 from spreading to the pixel region 101, which plays a role of obstructing water vapor and oxygen.

In some embodiments, the at least one separation pillar 1031 includes two or more separation pillars 1031. In this case, any two adjacent separation pillars 1031 are spaced apart. For example, as shown in FIGS. 2A, 2B and 5, two separation pillars 1031 are disposed in the isolation region 103, and the two separation pillars 1031 are spaced apart (that is, there is a gap between the two separation pillars 1031). The longitudinal section of each separation pillar 1031 is I-shaped. By arranging the two separation pillars 1031, it may further ensure that the light-emitting functional layer 1014 is disconnected in the isolation region 103. Therefore, a probability that the light-emitting functional layer 1014 is disconnected in the isolation region 103 may be increased, which may further ensure the effect of obstructing water vapor and oxygen.

Figure 6A:
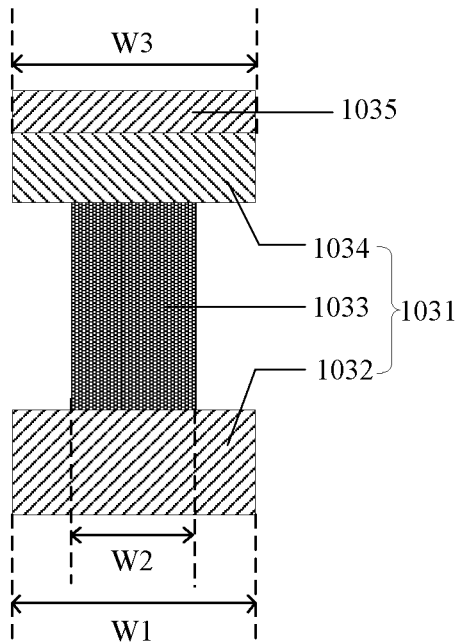
FIG. 6A is an enlarged schematic view showing structures of an separation pillar and a protection pattern in region F in FIG. 2A.
Figure 6B:
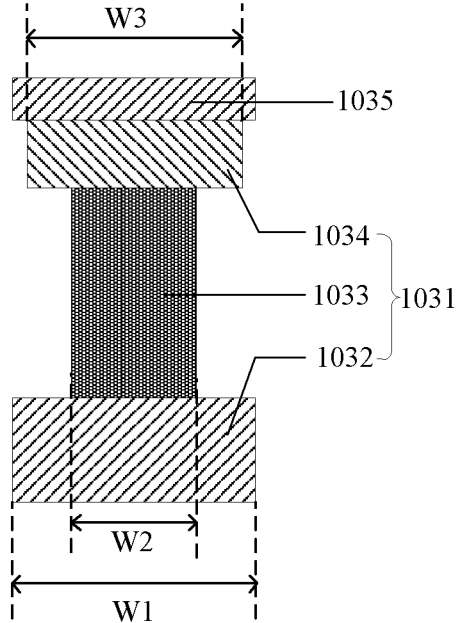
FIG. 6B is an enlarged schematic view showing structures of another separation pillar and another protection pattern in region F in FIG. 2A.
Figure 7:
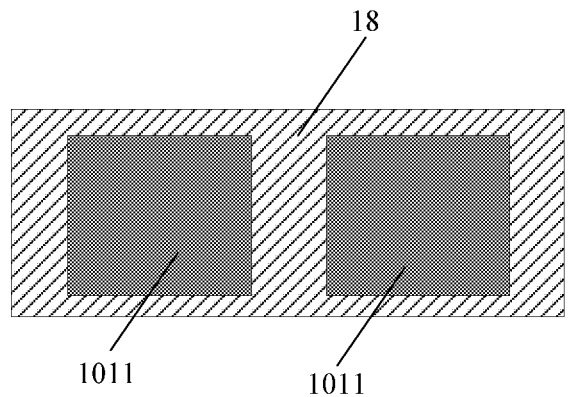
FIG. 7 is a top view of a light-emitting device and a pixel defining structure, according to some embodiments.

In some embodiments, as shown in FIGS. 2A, 6A and 6B, in the thickness direction of the base 13, the separation pillar

1031 includes a first separation portion 1032, a second separation portion 1033 and a third separation portion 1034 that are sequentially stacked and shaped in rings. Compared with the first separation portion 1032 and the third separation portion 1034, a side face of the second separation portion 1033 proximate to the central axis HH' of the separation pillar 1031 is farthest away from the central axis HH', and a side face of the second separation portion 1033 away from the central axis HH' is closest to the central axis HH'.

In some examples, as shown in FIG. 6A, a width W1 of the first separation portion 1032 is equal to a width W3 of the third separation portion 1034, and a width W2 of the second separation portion 1033 is less than the width W1 of the first separation portion 1032 and the width W3 of the third separation portion 1034. As shown in FIGS. 1 and 6A, the width of a separation portion may refer to a distance between two opposite side faces (i.e. the inner side face and the outer side face) of the separation portion along the radial direction of the separation portion, and the radial direction of the separation portion is also the radial direction of the opening region 102 and the isolation region 103. Since the width W2 of the second separation portion 1033 is less than the width W1 of the first separation portion 1032 and the width W3 of the third separation portion 1034, the light-emitting functional layer may be disconnected at side faces of the separation pillar 1031 when manufacturing the light-emitting device 1011.

In some other examples, as shown in FIG. 6B, the width W1 of the first separation portion 1032 is different from the width W3 of the third separation portion 1034, and the width W2 of the second separation portion 1033 is less than the width W1 of the first separation portion 1032 and the width W3 of the third separation portion 1034. For example, the width W1 of the first separation portion 1032 is greater than the width W3 of the third separation portion 1034. Since the width W2 of the second separation portion 1033 is less than the width W1 of the first separation portion 1032 and the width W3 of the third separation portion 1034, the light-emitting functional layer 1014 may be disconnected at side faces of the separation pillar 1031 when manufacturing the light-emitting device 1011.

In some embodiments, the material of the first separation portion 1032 is the same as the material of the third separation portion 1034, and the material of the second separation portion 1033 is different from the material of the first separation portion 1032 and the material of the third separation portion 1034. The etch rate of the material of the second separation portion 1033 is greater than the etch rate of the material of the first separation portion 1032 (and the third separation portion 1034).

It will be understood that the etch rate of the material of the first separation portion 1032, the etch rate of the material of the second separation portion 1033, and the etch rate of the material of the third separation portion 1034 refer to the etch rate of the material of the first separation portion 1032, the etch rate of the material of the second separation portion 1033, and the etch rate of the material of the third separation portion 1034 for a same kind of etching solution.

On this basis, the first separation portion 1032 and the third separation portion 1034 are made of a material with a low etch rate, and the second separation portion 1033 is made of another material with a high etch rate, so that it may be easy to form the separation pillar 1031 with the I-shaped longitudinal section structure in a wet etching process. Herein, terms "low" and "high" refer to the relative etching rates of the same etching solution acting on different materials. For example, the material of the first separation portion 1032 and the material of the third separation portion 1034 may be titanium (Ti), and the material of the second separation portion 1033 may be aluminum (Al). In this case, a structure of the separation pillar 1031 is a three-layer structure of a Ti layer, an Al layer and another Ti layer stacked. For example, in a case where the material of the separation pillar transition structure 104 is a metal material, the etching solution may be, for example, hydrochloric acid, nitric acid, or the like.

Since etch rates of different materials in a same etching solution are different, by selecting an appropriate etching solution and controlling etching time, the second separation portion 1033 may be indented inward relative to the first separation portion 1032 and the third separation portion 1034 with a required indentation. For example, each side face of the second separation portion 1033 is indented inward relative to the first separation portion 1032 and the third separation portion 1034 by 1 μm to 2 μm. Or, each side face of the second separation portion 1033 is indented inward relative to the first separation portion 1032 and the third separation portion 1034 by a distance greater than or equal to a thickness of the light-emitting functional layer, which may avoid a defect that the light-emitting functional layer 1014 cannot be completely disconnected due to an insufficient indentation of the second separation portion 1033 of the separation pillar 1031.

In some embodiments, as shown in FIGS. 2A to 2D, 6A and 6B, an orthographic projection of the separation pillar 1031 on the base 13 is within a range of an orthographic projection of the protection pattern 1035 on the base 13. For example, the protection pattern 1035 is disposed on a surface of the third separation portion 1034 facing away from the base 13, and the protection pattern 1035 is not in contact with the side faces of the separation pillar 1031.

In some examples, as shown in FIG. 6A, the orthographic projection of the protection pattern 1035 on the base 13 and the orthographic projection of the third separation portion 1034 on the base 13 coincide. That is, the side faces of the protection pattern 1035 are flush with the side faces of the third separation portion 1034 along the thickness direction of the base 13, respectively.

In some other examples, as shown in FIG. 6B, the orthographic projection of the protection pattern 1035 on the base 13 exceeds the range of the orthographic projection of the third separation portion 1034 on the base 13. In this case, the side faces of the protection pattern 1035 are not flush with the side faces of the third separation portion 1034 in the thickness direction of the base 13, respectively, and the protection pattern 1035 totally covers the third separation portion 1034.

For example, a material of the protection pattern 1035 includes an organic resin such as photosensitive polyimide. A thickness of the protection pattern 1035 in the thickness direction of the base 13 is in a range of approximately 10 nm to approximately 100 nm, for example, 10 nm, 30 nm, 60 nm, or 100 nm. By selecting an organic resin as the material of the protection pattern 1035, the protection pattern 1035 may be formed in synchronization with a planarization layer disposed in the pixel region 101. In addition, it may avoid the influence on the subsequent process due to excessive overall thickness of the separation pillar 1031 and the protective pattern 1035.

On the one hand, the protection pattern 1035 may play a role of protecting the third separation portion 1034 during the formation of the separation pillar 1031, thereby avoiding a problem that the width of the third separation portion 1034 is less than a preset value due to a fast etching speed of the etching solution. On the other hand, since the orthographic projection of the separation pillar 1031 on the base 13 is located within the range of the orthographic projection of the protection pattern 1035 on the base 13, even if the width of the third separation portion 1034 is less than the preset value, the overall structure of the separation pillar 1031 and the protection pattern 1035 is still I-shaped, and the light-emitting functional layer 1014 will still be disconnected.

In some embodiments, as shown in FIGS. 2A to 2D, the display panel 1 further includes an insulating layer. For example, the insulating layer may include or may be an interlayer insulating layer 15 in FIGS. 2A to 2C, or a gate insulating layer 145 in FIG. 2D. The at least one separation pillar 1031 is disposed on a first surface of the insulating layer facing away from the base 13. That is, the separation pillar 1031 is formed directly on the first surface of the insulating layer.

In some embodiments, as shown in FIGS. 2A to 2C, the display panel 1 further includes at least one first groove 151 formed in the first surface of the insulating layer. The at least one first groove 151 is located in the isolation region 103, and each first groove 151 is disposed around the opening region 102.

It will be noted that, the shape of the first groove 151 may be determined according to the shape of the opening region 102. For example, when the shape of the opening region 102 is a circle, the shape of the first groove 151 may be a circular ring. For another example, when the shape of the opening region 102 is a polygon, the shape of the first groove 151 may be a polygonal ring. For yet another example, when the shape of the opening region 102 is an ellipse, the shape of the first groove 151 may be an elliptical ring.

In some embodiments, the at least one first groove 151 includes one first groove 151. For example, the first groove 151 is disposed at a side of any separation pillar 1031 proximate to the opening region 102. Or, as shown in FIG. 2C, the first groove 151 is disposed at a side of any separation pillar 1031 away from the opening region 102. The side wall of the first groove 151 proximate to the separation pillar 1031 and the side face of the first separation portion 1032 of the separation pillar 1031 proximate to the first groove 151 may be in or substantially in a same plane or a same curved surface.

In some examples, as shown in FIG. 3A, the separation pillar 1031 is in the shape of the circular ring, the first groove 151 is in the shape of the circular ring, and the side wall of the first groove 151 proximate to the separation pillar 1031 and the side face of the first separation portion 1032 of the separation pillar 1031 proximate to the first groove 151 are in a same curved surface. In some other examples, as shown in FIG. 3B, the separation pillar 1031 is in the shape of the rectangular ring, the first groove 151 is in the shape of the rectangular ring, and a side wall of the first groove 151 proximate to the separation pillar 1031 and a side face of the first separation portion 1032 of the separation pillar 1031 proximate to the first groove 151 are in a same plane. For example, each side wall of the first groove 151 proximate to the separation pillar 1031 and a corresponding side face of the first separation portion 1032 of the separation pillar 1031 proximate to the first groove 151 are in a same plane.

In this case, the orthographic projection of the first groove 151 on the base 13 and the orthographic projection of the first separation portion 1032 of the separation pillar 1031 on the base 13 only overlap at the boundary therebetween.

In some other embodiments, the at least one first groove 151 includes two first grooves 151. In some examples, the at least one separation pillar 1031 includes one separation pillar 1031, and the two first grooves 151 are disposed on two sides of the separation pillar 1031 proximate to and away from the opening region 102, respectively. In some other examples, the at least one separation pillar 1031 includes two or more separation pillars 1031, and the two first grooves 151 may be disposed on two sides of any separation pillar 1031 proximate to and away from the opening region 102, respectively, or may be disposed on two sides of the two or more separation pillars 1031 proximate to and away from the opening region 102, respectively. Alternatively, the two first grooves 151 may be disposed on other positions, for example, one first groove 151 is disposed on a side of the separation pillar 1031 closest to the opening region 102 proximate to the opening region 102, and another first groove 151 is disposed between any two adjacent separation pillars 1031.

The side wall of each first groove 151 proximate to the separation pillar 1031 is in or substantially in a same plane or a same curved surface as the side face of the first separation portion 1032 of the separation pillar 1031 proximate to the first groove 151. In this case, the orthographic projection of each first groove 151 on the base 13 and the orthographic projection of the first separation portion 1032 of the separation pillar 1031 on the base 13 only overlap at the boundary therebetween.

It will be noted that, when the shapes of the first groove 151 and the separation pillar 1031 are circular rings or elliptical rings, the side wall of the first groove 151 proximate to the separation pillar 1031 and the side face of the first separation portion 1032 of the separation pillar 1031 proximate to the first groove 151 may be in or substantially in a same curved surface. When the shape of the first groove 151 and the separation pillar 1031 are polygonal rings, a side wall of the first groove 151 proximate to the separation pillar 1031 and a side face of the first separation portion 1032 of the separation pillar 1031 proximate to the first groove 151 may be in or substantially in a same plane.

In some other embodiments, as shown in FIGS. 2A and 2B, the at least one separation pillar 1031 includes more than two separation pillars 1031, and the at least one first groove 151 includes more than two separation pillars 151. In some examples, for each separation pillar 1031, a first groove 151 is provided at a side of the separation pillar 1031 proximate to the opening region 102, and another first groove 151 is provided at another side of the separation pillar 1031 away from the opening region 102. For example, only one first groove 151 may be disposed between any two adjacent separation pillars 1031. In this case, each side wall of the first groove 151 located between two adjacent separation pillars 1031 is in or substantially in a same plane or a same curved surface as the side face of a corresponding separation pillar 1031 in the two adjacent separation pillars 1031.

For example, as shown in FIG. 2A, the at least one separation pillar 1031 includes two separation pillars 1031, i.e., a first separation pillar 1031a and a second separation pillar 1031b, and the second separation pillar 1031b is located between the first separation pillar 1031a and the opening region 102. The at least one first groove 151 includes three first grooves 151, which are provided between the second separation pillar 1031b and the opening region 102, between the first separation pillar 1031a and the pixel region 101, and between the first separation pillar 1031a and the second separation pillar 1031b, respectively. One of two side walls of the first groove 151 located between the second separation pillar 1031b and the opening region 102 further away from the opening region 102 is in a same plane or a same curved surface as one of the two side faces of the second separation pillar 1031b closer to the opening region 102. One of the two side walls of the first groove 151 located between the first separation pillar 1031a and the pixel region 101 closer to the opening region 102 is in a same plane or a same curved surface as one of the two side faces of the first separation pillar 1031a further away from the opening region 102. One of the two side walls of the first groove 151 located between the first separation pillar 1031a and the second separation pillar 1031b closer to the opening region 102 is in a same plane or a same curved surface as one of the two side faces of the second separation pillar 1031b further away from the opening region 102, and the other side wall of the two side walls of the first groove 151 located between the first separation pillar 1031a and the second separation pillar 1031b is in a same plane or a same curved surface as one of the two side faces of the first separation pillar 1031a closer to the opening region 102.

In some embodiments, the depth of the first groove 151 is less than a thickness of the insulating layer.

In some other embodiments, the first groove 151 penetrates the insulating layer in a thickness direction of the insulating layer. That is, the first groove 151 is a via hole passing through the insulating layer.

In the display panel 1, the first groove 151 is disposed in the first surface of the insulating layer and disposed around the separation pillar 1031, which is equivalent to increasing a height of the separation pillar 1031 to a certain extent. Therefore, the height difference between the light-emitting functional layer 1014 and the base 13 is further increased in evaporation process of the light-emitting functional layer 1014, which may make the light-emitting functional layer 1014 more easily to disconnect at side faces of the separation pillar 1031.

In some embodiments, as shown in FIGS. 2A to 2D, the display panel 1 further includes a plurality of driving circuits 12 disposed between the base 13 and the light-emitting functional layer 1014. Each driving circuit 12 is disposed in a corresponding sub-pixel region 1010. The driving circuit 12 is configured to drive a corresponding light-emitting device 1011 to emit light. The driving circuit 12 includes a plurality of thin film transistors (TFTs). As shown in the rectangular dotted frame in FIGS. 2A to 2D, the TFT 14 includes a gate 141, an active pattern 144, a portion of the gate insulating layer 145 located between the gate 141 and the active pattern 144, a source 142 and a drain 143. The source 142 and the drain 143 are located at the side of the gate 141 away from the base 13. That is, the source 142 and the drain 143 are closer to the light-emitting functional layer 1014 relative to the gate 141. It will be noted that although only the TFT 14 in the driving circuit 12 is illustrated in FIGS. 2A to 2D, the driving circuit 12 may further include a capacitor in addition to the TFTs 14.

In some embodiments, at least one of the first separation portion 1032, the second separation portion 1033 and the third separation portion 1034 is disposed in a same layer as the source 142 and the drain 143 of the TFT 14.

Herein, the same layer means that a film for forming a specific pattern is formed by the same film forming process and then is patterned by one patterning process using the same mask to form a layer structure. Depending on the different specific patterns, the same patterning process may include several exposure, development or etching processes, the specific patterns in the formed layer structure may be continuous or discontinuous, and these specific patterns may also be at different heights or have different thicknesses.

In some examples, as shown in FIGS. 2A to 2D, each of the source 142 and the drain 143 may have a three-layer structure. That the separation pillar 1031 is disposed in the same layer as the source 142 and the drain 143 means that, the first separation portion 1032 is disposed in the same layer as the first layers of the source 142 and the drain 143, the second separation portion 1033 is disposed in the same layer as the second layers of the source 142 and the drain 143, and the third separation portion 1034 is disposed in the same layer as the third layers of the source 142 and the drain 143. In an example where each of the source 142 and the drain 143 have a three-layer structure of a first Ti layer, an Al layer and a second Ti layer stacked, the material of the first separation portion 1032 is Ti and the first separation portion 1032 is disposed in the same layer as the first Ti layer; the material of the second separation portion 1033 is Al and the second separation portion 1033 is disposed in the same layer as the Al layer; and the material of the third separation portion 1034 is Ti and the third separation portion 1034 is disposed in the same layer as the second Ti layer. That is, the separation pillar 1031 also has a three-layer structure of the first Ti layer, the Al layer and the second Ti layer stacked.

On this basis, the separation pillar 1031 may be formed while the source 143 and the drain 143 of the driving circuit 12 are formed, thereby simplifying the manufacturing process of the display panel 1.

In some other examples, one of the first separation portion 1032, the second separation portion 1033 and the third separation portion 1034 is disposed in the same layer as the source 142 and the drain 143, and another two of the first separation portion 1032, the second separation portion 1033 and the third separation portion 1034 may be disposed in the same layers as other layers. In yet some other examples, at least one of the first separation portion 1032, the second separation portion 1033 and the third separation portion 1034 is disposed in the same layer as the gate 141. For example, one of the first separation portion 1032, the second separation portion 1033 and the third separation portion 1034 is disposed in the same layer as the gate 141, and another two of the first separation portion 1032, the second separation portion 1033 and the third separation portion 1034 are disposed in the same layers as other films.

In a case where any one of the first separation portion 1032, the second separation portion 1033 and the third separation portion 1034 is disposed in the same layer as the gate 141 or as both the source 142 and the drain 143, the thickness of an separation portion disposed in the same layer as the gate 141 or as both the source 142 and the drain 143 is greater than the thickness of each of other separation portions. For example, if the first separation portion 1032 is disposed in the same layer as the gate 141 or as both the source 142 and the drain 143, the thickness of the first separation portion 1032 is greater than the thickness of each of the second separation portion 1033 and the thickness of the third separation portion 1034. For example, since the thicknesses of the gate 141, the source 142 and the drain 143 have a certain influence on the performance of the TFT 14, in order to ensure a thickness of the TFT 14, the thickness of the first separation portion 1032 may be greater than the thickness of each of the second separation portion 1033 and third separation portion 1034.

In some embodiments, as shown in FIGS. 2A to 2C, the TFT 14 is a top-gate TFT. In this case, the insulating layer is the interlayer insulating layer 15. The active pattern 144 is disposed at the side of the gate 141 proximate to the base 13, and the interlayer insulating layer 15 is disposed between the gate 141 and both the source 142 and the drain 143. The source 142 and the drain 143 are in contact with the active pattern 144 through a first via hole 1531 and a second via hole 1532 passing through at least the interlayer insulating layer 15, respectively.

In some examples, as shown in FIGS. 2A and 2B, the active pattern 144, the gate insulating layer 145, the gate 141, the interlayer insulating layer 15, and both the source 142 and the drain 143 are sequentially stacked in the direction away from the base 13, and the gate insulating layer 145 includes a plurality of gate insulating blocks 1450 disposed at intervals. Each gate insulating block 1450 is located in a corresponding TFT 14. The area of the gate insulating block 1450 in the corresponding TFT 14 is less than the area of the active pattern 144. The source 142 and the drain 143 are in contact with the active pattern 144 through the first via hole 1531 and the second via hole 1532 that only pass through the interlayer insulating layer 15, respectively.

In some other examples, as shown in FIG. 2C, the active pattern 144, the gate insulating layer 145, the gate 141, the interlayer insulating layer 15, and both the source 142 and the drain 143 are sequentially stacked in the direction away from the base 13, and the gate insulating layer 145 has an integrated structure. The first via hole 1531 and the second via hole 1532 pass through the gate insulating layer 145 and the interlayer insulating layer 15. The source 142 and the drain 143 are in contact with the active pattern 144 through the first via hole 1531 and the second via hole 1532 passing through both the gate insulating layer 145 and the interlayer insulating layer 15, respectively.

For example, the material of the interlayer insulating layer 15 is polybenzobisoxazole, photosensitive polyimide, benzocyclobutene, or an inorganic material. The first groove 151 is disposed in the surface of the interlayer insulating layer 15 facing away from the base 13, and the first groove 151 may be formed through a dry etching process.

In some other embodiments, as shown in FIG. 2D, the TFT 14 is a bottom-gate TFT. In this case, the insulating layer is the gate insulating layer 145. The active pattern 144 is disposed between the gate 141 and both the source 142 and the drain 143.

For example, as shown in FIG. 2D, the gate 141, the gate insulating layer 145, the active pattern 144, and both the source 142 and the drain 143 are sequentially stacked in the direction away from the base 13. The source 142 and the drain 143 are directly disposed on a surface of the active pattern 144 facing away from the base 13. The material of the gate insulating layer 145 is silicon oxide, silicon nitride, or silicon oxynitride.

In some embodiments, as shown in FIGS. 2A to 2D, the display panel 1 further includes a planarization layer 160 located in the pixel region 101. The planarization layer 160 is disposed between the driving circuit 12 and the light-emitting functional layer 1014. The planarization layer 160 may be disposed in the same layer as the protection pattern 1035. The thickness of the planarization layer 160 is greater than the thickness of the protection pattern 1035. In some examples, the planarization layer 160 and the protection pattern 1035 is formed using a half-tone mask, thereby forming the planarization layer 160 and the protection pattern 1035 with different thicknesses.

The planarization layer 160 is used to flatten the surface of the TFT 14 for subsequent formation of the light-emitting functional layer 1014. The material of the planarization layer 160 is, for example, photosensitive polyimide, but it is not limited thereto.

The planarization layer 160 and the protection pattern 1035 are disposed in a same layer. That is, the planarization layer 160 and the protection pattern 1035 are simultaneously formed to simplify the manufacturing process of the display panel 1. On this basis, the thickness of the protection pattern 1035 is set to be less than the thickness of the planarization layer 160, so that an excessive overall thickness of the separation pillar 1031 and the protection pattern 1035 may be avoided, thereby avoiding impact on subsequent processes.

In some embodiments, the display panel 1 further includes an encapsulation structure, and the encapsulation structure is disposed on the surfaces of the cathode 1013 facing away from the base 13.

For example, the encapsulation structure is composed of encapsulation films. As shown in FIGS. 2A to 2D, the encapsulation films include a first inorganic encapsulation layer 19, an organic encapsulation layer 20, and a second inorganic encapsulation layer 21 that are sequentially stacked along the direction away from the base 13.

The first inorganic encapsulation layer 19 and the second inorganic encapsulation layer 21 may prevent water vapor and oxygen from entering the light-emitting functional layer 1014 from the side of the display panel 1 away from the base 13. Materials of the first inorganic encapsulation layer 19 and the second inorganic encapsulation layer 21 are inorganic substances, such as silicon nitride and/or silicon oxide. The materials of the first inorganic encapsulating layer 19 and the second inorganic encapsulating layer 21 may be same or different.

The organic encapsulation layer 20 may prevent inorganic particles in the first inorganic encapsulation layer 19 from affecting the formation of the second inorganic encapsulation layer 21, so as to avoid causing cracks of the second inorganic encapsulation layer 21. That is, the organic encapsulation layer 20 has a flattening effect on the first inorganic encapsulation layer 19. A material of the organic encapsulation layer 20 is, for example, acrylic.

In some embodiments, as shown in FIGS. 2A to 2D, the display panel 1 further includes a first barrier 1036 and a second barrier 1037 that are located in the isolation region 103, and the first barrier 1036 and the second barrier 1036 are both disposed around the opening region 102. The first barrier 1036 is disposed between the opening region 102 and the at least one separation pillar 1031. The second barrier 1037 is disposed between the first barrier 1036 and the opening region 102. In the thickness direction of the base 13, the distance from the surface of the first barrier 1036 facing away from the base 13 to the surface of the base 13 facing the first barrier 1036 is less than the distance from a surface of the second barrier 1037 facing away from the base 13 to this surface of the base 13.

In some examples, the first barrier 1036 and the second barrier 1037 are both disposed on the surface of the insulating layer facing away from the base 13. In this case, in the thickness direction of the base 13, a thickness of the first barrier 1036 is less than a thickness of the second barrier 1037, so that the distance from the surface of the first barrier 1036 facing away from the base 13 to the surface of the base 13 is less than the distance from the surface of the second barrier 1037 facing away from the base 13 to the surface of the base 13. Herein, the first barrier 1036 and the second barrier 1037 with different thicknesses may be formed through a half-tone mask.

In some other examples, the first barrier 1036 is disposed on the surface of the insulating layer facing away from the base 13, and the display panel 1 further includes a structure disposed between the insulating layer and the second barrier 1037. The second barrier 1037 is disposed on the surface of the structure facing away from the base 13, so that the distance from the surface of the first barrier 1036 facing away from the base 13 to the surface of the base 13 is less than the distance from the surface of the second barrier 1037 facing away from the base 13 to the surface of the base 13. Herein, the insulating layer refers to the insulating layer in contact with the separation pillar 1031, and the insulating layer may be the gate insulating layer 145 or the interlayer insulating layer 15, which depends on the structure of the display panel 1.

As shown in FIGS. 2A to 2D, and 3A, each of the first barrier 1036 and the second barrier 1037 extends along the isolation region 103, and a shape of a longitudinal section of each of the first barrier 1036 and the second barrier 1037 perpendicular to the extending direction of the first barrier 1036 and the second barrier 1037 may be a trapezoid, a rectangle, etc. In a case where the shapes of the longitudinal sections of the first barrier 1036 and the second barrier 1037 are trapezoids, a length of the top side of the trapezoid is less than a length of the bottom side thereof.

In the encapsulation process of the thin film, since the organic material used to form the organic encapsulation layer 20 has a certain fluidity, in order to facilitate the formation of the organic encapsulation layer 20, the first barrier 1036 may be provided to intercept the organic material from flowing toward the opening region 102, and the second barrier 1037 may be provided to further intercept the organic material, so as to avoid the organic material spreading to the opening region 102 due to insufficient interception of the first barrier 1036.

In some embodiments, as shown in FIGS. 2A to 2D, and 7, the display panel 1 further includes a pixel defining structure 18 located in the pixel region 101. The pixel defining structure 18 is located between adjacent sub-pixel regions 1010, and is used for separating adjacent light-emitting devices 1011 to avoid the short circuit problem in the pixel region 101. The first barrier 1036 and the second barrier 1037 are disposed in the same layer as the pixel defining structure 18. That is, the first barrier 1036, the second barrier 1037 and the pixel defining structure 18 may be formed by using a mask and through exposure, etching and other processes based on the same film. By arranging the first barrier 1036 and the second barrier 1037 in the same layer as the pixel defining structure 18, the first barrier 1036, the second barrier 1037 and the pixel defining structure 18 may be formed synchronously to simplify the manufacturing process.

For example, the pixel defining structure 18 may be disposed on the surface of the planarization layer 160 facing away from the base 13. The pixel defining structure 18 may cover part of each of the anodes 1012. In this case, the anodes 1012 are formed first, and then the pixel defining structure 18 is formed. The material of the pixel defining structure 18 may be, for example, a photoresist, and the photoresist includes at least one of polyimide, organosilane, or polymethyl methacrylate-based.

In some embodiments, as shown in FIGS. 2A to 2D, the structure disposed between the insulating layer and the second barrier 1037 may be a raised portion 161. The raised portion 161 is disposed on a surface of the second barrier 1037 proximate to the base 13. The raised portion 161 may be disposed in the same layer as the planarization layer 160. That is, the raised portion 161 and the planarization layer 160 may be formed by using a mask and through exposure, etching and other processes based on the same film.

Herein, for example, in the thickness direction of the base 13, the distance between the surface of the raised portion 161 facing away from the base 13 and the opposite surface of the raised portion 161, i.e., the height of the raised portion 161, is 1.5 μm. By arranging the raised portion 161 below the second barrier 1037, the distance from the surface of the second barrier 1037 facing away from the base 13 to the surface of base 13 is increased, which may enhance the effect of the second barrier 1037 to intercept the organic materials. In addition, by arranging the raised portion 161 and the planarization layer 160 in the same layer, the raised portion 161 and the planarization layer 160 may be formed synchronously, which may simplify the manufacturing process of the display panel 1.

In some embodiments, as shown in FIGS. 2A to 2C, at least one second groove 152 is disposed in the first surface of the insulating layer and is located in the isolation region 103. The at least one second groove 152 is disposed between the opening region 102 and both the second barrier 1037 and the raised portion 161, and surrounds the opening region 102. Herein, the insulating layer is an insulating layer in contact with the separation pillar 1031, and the insulating layer may be the gate insulating layer 145 or the interlayer insulating layer 15.

The second groove 152 is arranged in the same way as the first groove 151. For example, a depth of the second groove 152 is less than the thickness of the insulating layer. Or, the second groove 152 penetrates the insulating layer in the thickness direction of the insulating layer, that is, the second groove 152 is a via hole passing through the insulating layer. On this basis, since the second groove 152 is disposed between the second barrier 1037 and the opening region 102, it is possible to prevent cracks generated in forming the opening in the opening region 102 from spreading to the pixel region 101.

In some embodiments, the depth of the first groove 151 and the depth of the second groove 152 are equal. For example, each of the depth of the first groove 151 and the depth of the second groove 152 ranges from 500 nm to 1500 nm. For example, both the depth of the first groove 151 and the depth of the second groove 152 are 500 nm, 800 nm, 1200 nm, or 1500 nm. Of course, the depth of the first groove 151 and the depth of the second groove 152 may be different. For example, the depth of the first groove 151 may be 500 nm, 700 nm, 1000 nm or 1500 nm, and the depth of the second groove 152 may be 550 nm, 800 nm, 1200 nm or 1400 nm.

Figure 8:
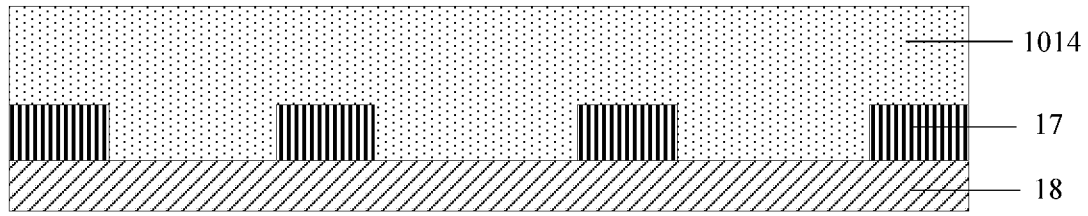
FIG. 8 is a schematic diagram showing structures of a pixel defining structure, a columnar spacer layer and a light-emitting functional layer, according to some embodiments.

In some embodiments, as shown in FIG. 8, in a case where the light-emitting function layer 1014 includes a plurality of light-emitting layers 1015 spaced apart from each other, the display panel 1 further includes a columnar spacer layer 17. The columnar spacer layer 17 is disposed between the pixel defining structure 18 and the light-emitting function layer 1014.

For example, the columnar spacer layer 17 includes a plurality of columnar spacers disposed at intervals. The columnar spacer layer 17 is used to support and protect a fine metal mask (FMM) used in forming the light-emitting layer 1015, so as to prevent the FMM from directly contacting the pixel defining structure 18 and scratching the pixel defining structure 18, thereby preventing an electrostatic breakdown. The material of the columnar spacer is, for example, photosensitive polyimide.

In some embodiments, the base 13 is a flexible base. For example, the material of the base 13 is non-photosensitive polyimide. The display panel 1 with the flexible base can be bent and used in wider application fields.

Figure 14:
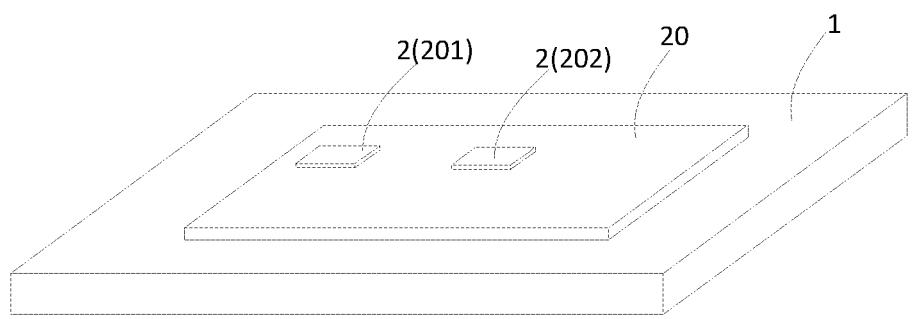
FIG. 14 is a structural diagram of a display apparatus, according to some embodiments.

Some embodiments of the present disclosure provide a display apparatus 100. As shown in FIG. 14, the display apparatus 100 includes the display panel 1 and drivers 2 used for driving the display panel 1. For example, the drivers 2 include a source driver 201 and a timing controller 202. Both the source driver and the timing controller may be disposed on a printed circuit board 20 and bound to the display panel 1. The beneficial effects of the display apparatus 100 are the same as the beneficial effects of the display panel 1 provided by some embodiments of the present disclosure, and thus will be not repeated here.

Some embodiments of the present disclosure provide a method of manufacturing the display panel 1. As shown in FIG. 1, the display panel 1 has the display area 10. The display area 10 includes the pixel region 101, the opening region 102, and the isolation region 103 located between the pixel region 101 and the opening region 102. The isolation region 103 is disposed around the opening region 102.

Figure 9:
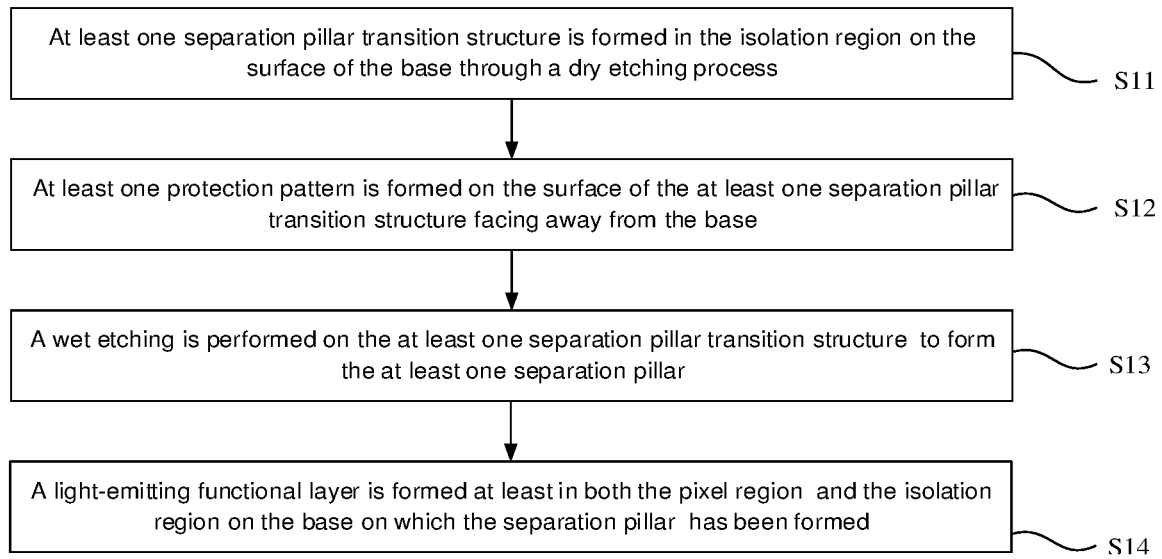
FIG. 9 is a flowchart of a method of manufacturing a display panel, according to some embodiments.

As shown in FIG. 9, the method of manufacturing the display panel 1 includes step 11 (S11) to step 14 (S14).

Figure 10:
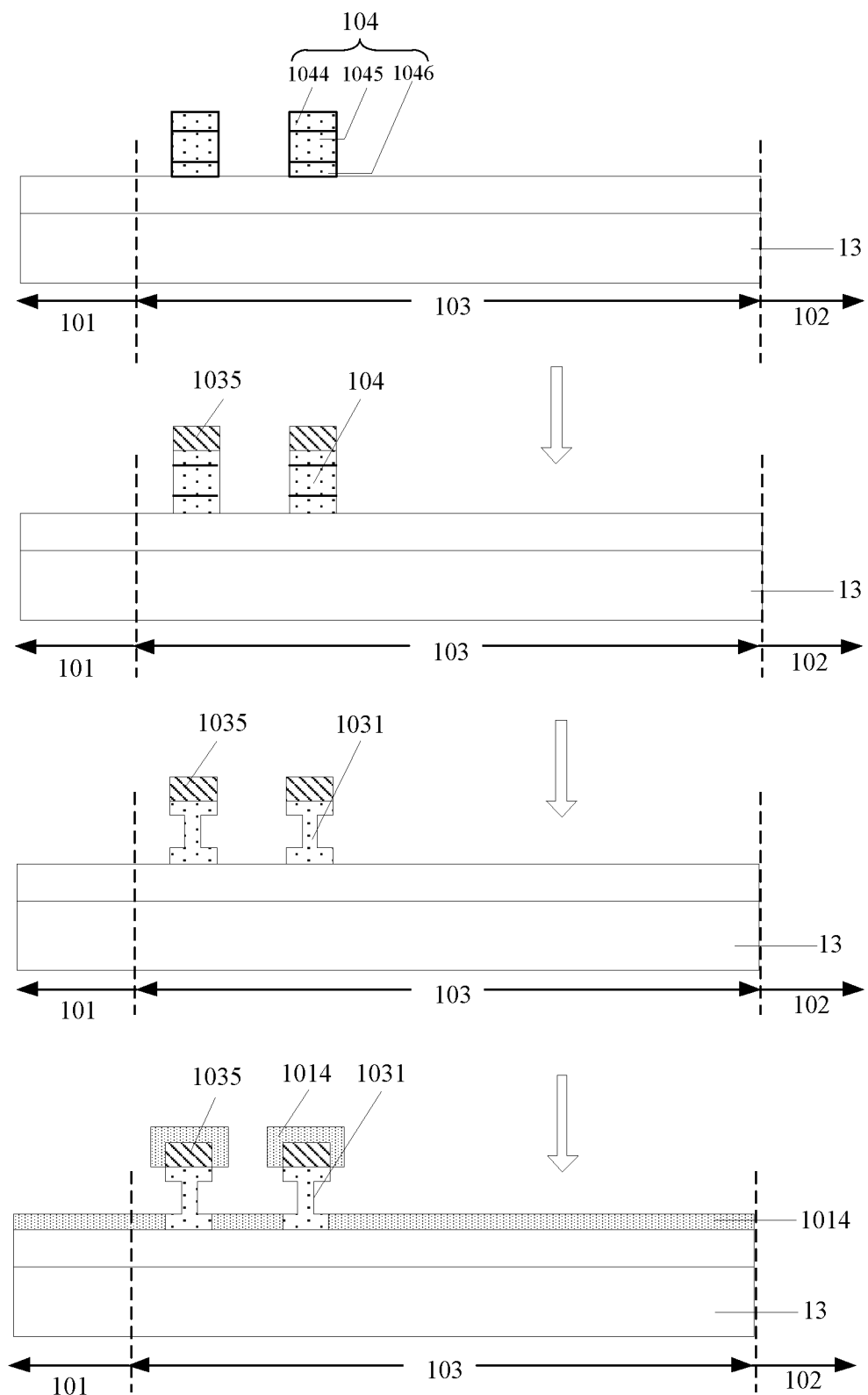
FIG. 10 is a schematic diagram showing a process of forming a display panel, according to some embodiments.

In S11, as shown in FIG. 10, at least one separation pillar transition structure 104 is formed in the isolation region 103 on the base 13 through a dry etching process. Each separation pillar transition structure 104 is disposed around the opening region 102.

FIG. 10 shows an example in which the at least one separation pillar transition structure 104 includes two separation pillar transition structures 104. However, the number of the at least one separation pillar transition structure 104 is not limited thereto, and may be one or more than two.

The dry etching refers to technology of etching a film using plasma. The gas used in the dry etching process includes, for example, at least one of chlorine, helium, oxygen, or boron trichloride. The shape of the longitudinal section of the separation pillar transition structure 104 may be a rectangle or a trapezoid.

It will be noted that, the separation pillar transition structure 104 may be directly formed on the base 13, or may be formed on a base 13 on which other layers have been formed, which means that the separation pillar transition structure 104 is formed on other layers. In addition, as for the formation of other structures on the base 13, reference may be made to the explanation of forming the separation pillar transition structure 104 on the base 13 here, which will not be described in detail.

In S12, as shown in FIG. 10, at least one protection pattern 1035 is formed on the surface of the at least one separation pillar transition structure 104 facing away from the base 13.

The protection pattern 1035 may be made of organic resin, such as a photoresist material, and formed through exposure, development and other processes.

In some examples, the orthographic projection of the protection pattern 1035 on the base 13 and an orthographic projection of the separation pillar transition structure 104 on the base 13 completely coincide. That is, the side faces of the protection pattern 1035 are substantially flush with the side faces of the separation pillar transition structure 104, respectively.

In some other examples, the orthographic projection of the separation pillar transition structure 104 on the base 13 is within the range of the orthographic projection of the protection pattern 1035 on the base 13. That is, the orthographic projection of the protection pattern 1035 on the base 13 exceeds the range of the orthographic projection of the separation pillar transition structure 104 on the base 13. In this case, the side face of the protection pattern 1035 is not flush with the side face of the separation pillar transition structure 104, and in the thickness direction of the base 13, and the side face of the protection pattern 1035 is suspended at the side face of the separation pillar transition structure 104.

In S13, as shown in FIG. 10, a wet etching is performed on the at least one separation pillar transition structure 104 to form the at least one separation pillar 1031. The shape of the longitudinal section of the separation pillar 1031 is I-shaped.

The wet etching refers to a process of etching a film with an etching solution. For example, in a case where the material of the separation pillar transition structure 104 is a metal material, the etching solution used in the wet etching process may be, for example, hydrochloric acid or, nitric acid, or the like.

In some embodiments, as shown in FIGS. 2A, 6A, and 6B, in the thickness direction of the base 13, the separation pillar 1031 includes a first separation portion 1032, a second separation portion 1033, and a third separation portion 1034 that are sequentially stacked. Compared with the first separation portion 1032 and the third separation portion 1034, a side face of the second separation portion 1033 proximate to a central axis HH' of the separation pillar 1031 is indented along a direction away from the central axis HH', and a side face of the second separation portion 1033 away from the central axis HH' is indented along a direction pointing to the central axis HH'. In this case, each side face of the second separation portion 1033 is indented inward relative to the first separation portion 1032 and the third separation portion 1034.

In the process of wet etching of the separation pillar transition structure 104 located below the protection pattern 1035, the protection pattern 1035 may protect the top portion (i.e., the portion of the separation pillar transition structure 104 adjacent to the protection pattern 1035) of the separation pillar transition structure 104, which may avoid a narrow top portion of the separation pillar transition structure 104 due to an excessive etch rate of the etching solution. Therefore, it may be conducive for forming the I-shaped separation pillar 1031.

In S14, as shown in FIG. 10, a light-emitting functional layer 1014 is formed at least in both the pixel region 101 and the isolation region 103 on the base 13 on which the separation pillar 1031 has been formed.

As shown in FIG. 10, the inner side face 1031A and the outer side face 1031B of the separation pillar 1031 are not covered by the light-emitting functional layer 1014. That is, the light-emitting functional layer 1014 is disconnected at side faces of the separation pillar 1031.

For example, the light-emitting functional layer 1014 may be formed through evaporation with a fine metal mask.

In the method of manufacturing the display panel 1, by forming the separation pillar transition structure 104 and the protection pattern 1035 in the isolation region 103, and then performing a wet etching on the separation pillar transition structure 104, the I-shaped separation pillar 1031 may be formed. On the one hand, the light-emitting functional layer 1014 formed in the subsequent process may be disconnected at side faces of the separation pillar 1031. On the other hand, since the protection pattern 1035 is not affected by the wet etching process, the overall structure of the protection pattern 1035 and the separation pillar 1031 is I-shaped. Therefore, the probability that the light-emitting functional layer 1014 is disconnected at side faces of the separation pillar 1031 may be increased. On this basis, water vapor and oxygen entering part of the light-emitting functional layer 1014 located in the isolation region 103 from the opening region 102 may not continue spreading to the pixel region 101, thereby obstructing water vapor and oxygen.

In some embodiments, the S11, in which at least one separation pillar transition structure 104 is formed in the isolation region 103 on the base 13 through a dry etching process, includes step 101 (S101) and step 102 (S102).

Figure 11A:
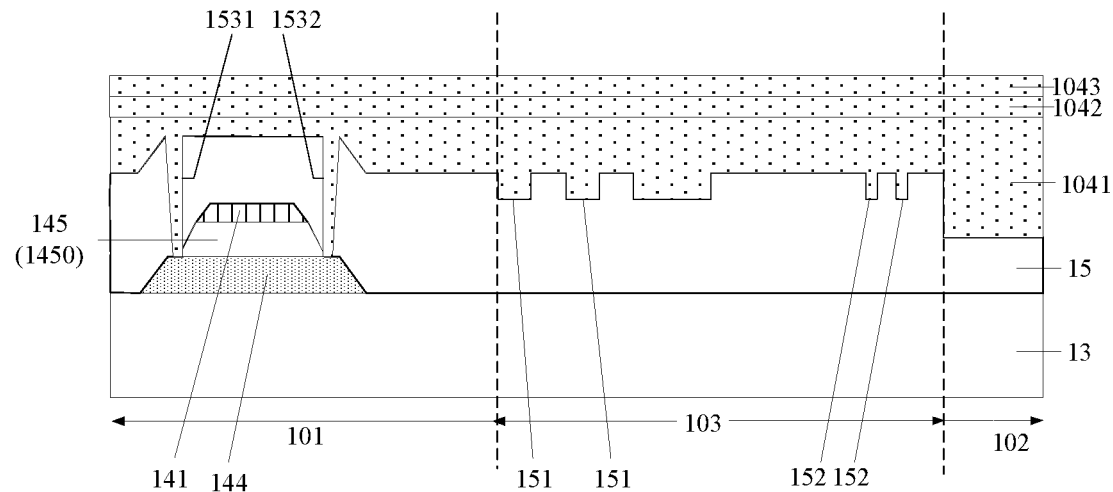
FIG. 11A is a schematic diagram showing a process of forming a first separation film, a second separation film and a third separation film, according to some embodiments.

In S101, as shown in FIG. 11A, a first separation film 1041, a second separation film 1042 and a third separation film 1043 are sequentially formed on the base 13.

The material of the first separation film 1041 is the same as the material of the third separation film 1043. The material of the second separation film 1042 is different from the material of the first separation film 1041 and the material of the third separation film 1043. The etch rate of the material of the first separation film 1041 and the third separation film 1043 is less than the etch rate of the material of the second separation film 1042.

For example, the material of the first separation film 1041 and the material of the third separation film 1043 may be titanium (Ti), and the material of the second separation film 1042 may be aluminum (Al).

Figure 11B:
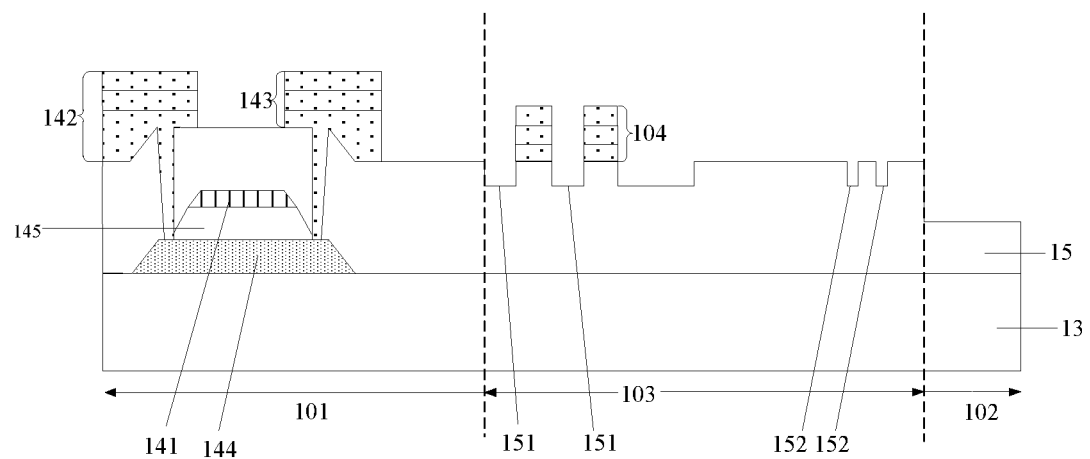
FIG. 11B is a schematic diagram showing a process of forming a source, a drain and a separation pillar transition structure, according to some embodiments.

In S102, as shown in FIG. 11B, the first separation film 1041, the second separation film 1042 and the third separation film 1043 are etched through the dry etching process, so as to form at least one separation pillar transition structure 104 in the isolation region 103. As shown in FIGS. 10 and 11B, each separation pillar transition structure 104 includes a first separation pattern 1044, a second separation pattern 1045 and a third separation pattern 1046. In the embodiments described above, the etch rate of the material of the first separation film 1041 and the etch rate of the material of the third separation film 1043 are less than the etch rate of the material of the second separation film 1042, which may ensure that the separation pillar transition structure 104 having an rectangular or trapezoidal longitudinal section is etched into the separation pillar 1031 having an I-shaped longitudinal section in the same etching solution. After performing the wet etching process on the first separation pattern 1044, the second separation pattern 1045 and the third separation pattern 1046, the first separation portion 1032, the second separation portion 1033 and the third separation portion 1034 are formed, respectively.

In some embodiments, before forming the at least one separation pillar transition structure 104 in the isolation region 103 on the base 13 through a dry etching process, the method of manufacturing the display panel 1 further includes step 10 (S10) and step 20 (S20).

Figure 12:
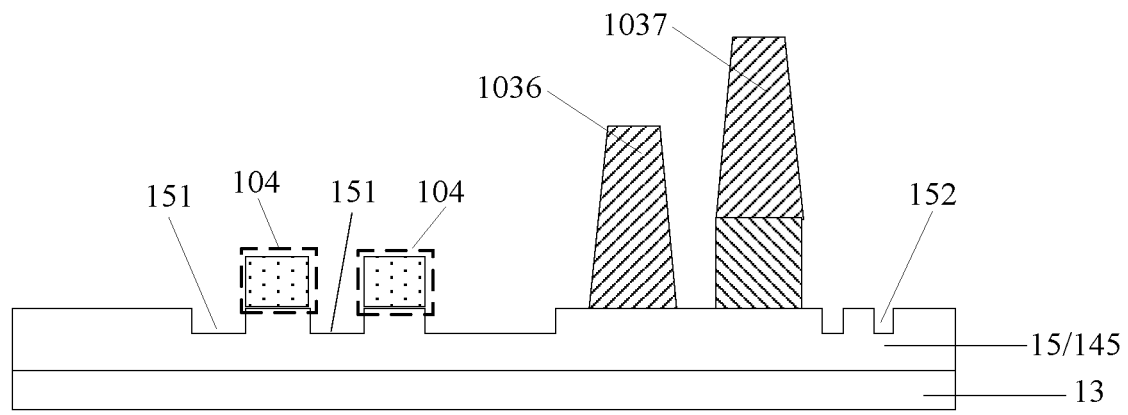
FIG. 12 is a schematic diagram showing a process of forming a first groove and a second groove, according to some embodiments.
Figure 15:
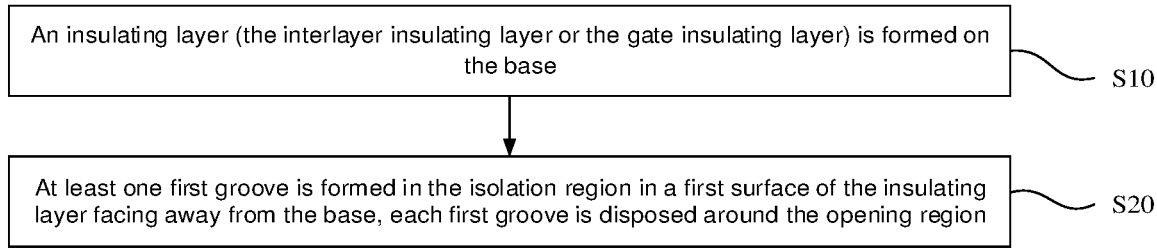
FIG. 15 a flowchart of another method of manufacturing a display panel, according to some embodiments.

In S10, as shown in FIG. 12 and FIG. 15, an insulating layer (the interlayer insulating layer 15 or the gate insulating layer 145) is formed on the base 13.

In S20, as shown in FIG. 12 and FIG. 15, at least one first groove 151 is formed in the isolation region 103 in a first surface of the insulating layer facing away from the base 13. Each first groove 151 is disposed around the opening region 102.

In some embodiments, each separation pillar transition structure 104 is formed on a side of the first groove 151 proximate to or away from the opening region 102, and the side wall of the first groove 151 proximate to the separation pillar transition structure 104 and the side face of the separation pillar transition structure 104 proximate to the first groove 151 are in or substantially in a same plane or a same curved surface.

In some other embodiments, each separation pillar transition structure 104 is formed between two adjacent first grooves 151, and the side wall of the first groove 151 proximate to the separation pillar transition structure 104 and the side face of the separation pillar transition structure 104 proximate to the first groove 151 are in or substantially in a same plane or a same curved surface.

The first groove 151 is indented toward the base 13 relative to the surface of the separation pillar transition structure 104 proximate to the base 13. In a case where the at least one first groove 151 includes a plurality of first grooves 151, two adjacent first grooves 151 are spaced apart.

The formation of the first groove 151 may be equivalent to increasing a height of the separation pillar 1031 that is to be formed to a certain extent. Therefore, the height difference between the light-emitting functional layer 1014 and the base 13 is further increased in evaporation process of the light-emitting functional layer 1014, which may make the light-emitting functional layer 1014 more easily to disconnect at side faces of the separation pillar 1031.

In some example, the separation pillar transition structure 104 and the first groove 151 may be formed by the same patterning process, which may be achieved by etching the first separation film 1041, the second separation film 1042, the third separation film 1043, and the insulating layer film by a half-tone mask.

For example, an insulating film, the first separation film 1041, the second separation film 1042, and the third separation film 1043 are sequentially formed on the base 13, and then a photoresist is coated on the third separation film 1043. A half-tone mask is used to expose the photoresist to form a photoresist removal portion corresponding to a first groove to be formed, a photoresist completely residual portion corresponding to a separation pillar transition structure to be formed, and a photoresist semi-residual portion corresponding to other positions. The first groove 151 is formed in a portion of the insulating film corresponding to the photoresist removal portion through an etching process, and then an ashing is performed on the photoresist for removing the photoresist semi-residual portion, and thinning the photoresist completely residual portion. Then, the portions of the first separation film 1041, the second separation film 1042, and the third separation film 1043 corresponding to the photoresist semi-residual portions are removed through an etching process, so that the portions of the first separation film 1041, the second separation film 1042 and the third separation film 1043 corresponding to the photoresist completely residual portion form the separation pillar transition structure 104. Finally, the remaining photoresist is removed.

On this basis, since fewer patterning processes are used in the process of forming the separation pillar transition structure 104 and the first groove 151, the manufacturing process may be relatively simple.

In some embodiments, the pixel region 101 includes a plurality of sub-pixel regions 1010. As shown in FIGS. 11A and 11B, before forming the light-emitting functional layer 1014 at least in both the pixel region 101 and the isolation region 103 on the base 13 on which the separation pillar 1031 has been formed, the method of manufacturing the display panel 1 further includes: forming a driving circuit 12 in each sub-pixel region 1010 on the base 13. The driving circuit 12 includes a plurality of TFTs 14. Each TFT 14 includes a gate 141, an active pattern 144, a portion of a gate insulating layer 145 located between the gate 141 and the active pattern 144, a source 142 and a drain 143.

At least one of the first separation pattern 1044, the second separation pattern 1045, and the third separation pattern 1046 is formed in synchronization with the source 142 and the drain 143. Herein, the synchronous formation refers to a formation based on a same film and adopting a same patterning process. It will be understood that when different structures are formed and the patterning processes adopted are different, the patterns of the masks used are also different.

FIGS. 11A and 11B show an example where the separation pillar transition structure 104 is formed in synchronization with the source 142 and the drain 143.

At least one of the first separation pattern 1044, the second separation pattern 1045, and the third separation pattern 1046 is formed in synchronization with the source 142 and the drain 143, which may simplify the manufacturing process of the display panel 1.

In an example where the TFT 14 is a top-gate TFT, and the source 142 and the drain 143 of the TFT 14 have a three-layer structure. The separation pillar transition structure 104 is formed through the same patterning process as the source 142 and the drain 143.

In some embodiments, the step of forming a driving circuit in each sub-pixel region on the base includes step 501 (S501) to step 504 (S504).

Figure 16:
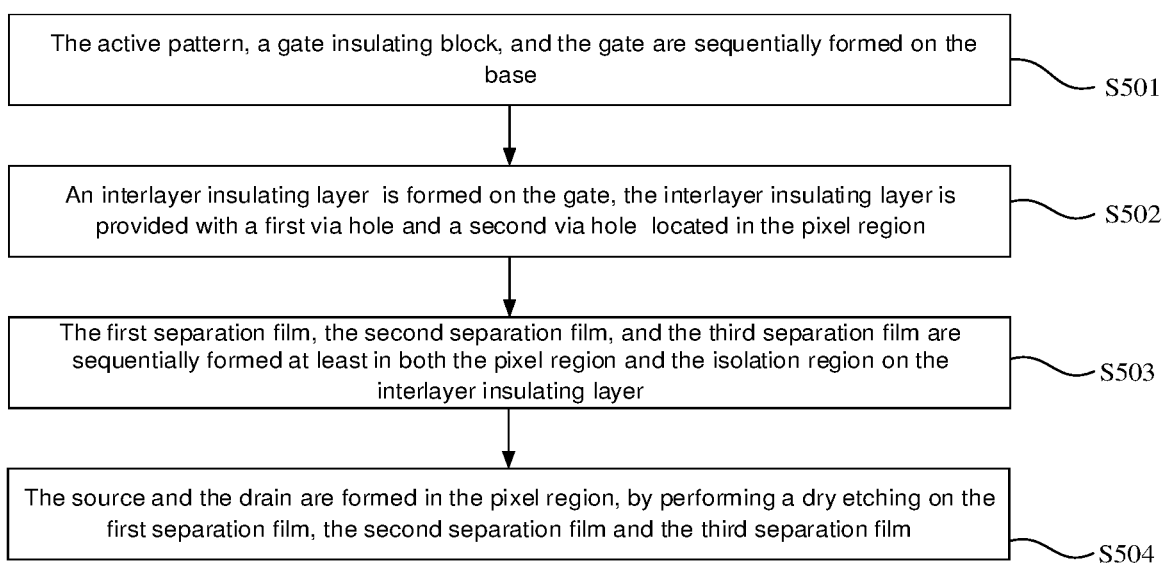
FIG. 16 is a flowchart of yet another method of manufacturing a display panel, according to some embodiments.

In S501, as shown in FIG. 11A and FIG. 16, the active pattern 144, a gate insulating block 1450, and the gate 141 are sequentially formed on the base 13.

For example, the active pattern 144 and the gate 141 are formed by magnetron sputtering deposition and a corresponding patterning process.

The area of the orthographic projection of the gate insulating block 1450 on the base 13 is less than the area of the orthographic projection of the active pattern 144 on the base 13, so as to expose a portion of the active pattern 144.

In S502, as shown in FIG. 11A and FIG. 16, an interlayer insulating layer 15 is formed on the gate 141. The interlayer insulating layer 15 is provided with a first via hole 1531 and a second via hole 1532 located in the pixel region 101.

For example, a film may be formed by high-temperature vapor deposition and then is patterned by a corresponding patterning process to form the interlayer insulating layer 15. The formed first via hole 1531 and second via hole 1532 pass through the interlayer insulating layer 15 to expose the portion of the active pattern 144 that is not shielded by the gate 141.

In some embodiments, a plurality of first grooves 151 is formed in the isolation region 103 in the surface of the interlayer insulating layer 15.

In S503, as shown in FIG. 11A and FIG. 16, the first separation film 1041, the second separation film 1042, and the third separation film 1043 are sequentially formed at least in both the pixel region 101 and the isolation region 103 on the interlayer insulating layer 15.

For example, the first separation film 1041, the second separation film 1042, and the third separation film 1043 may be formed by the magnetron sputtering process. For example, the first separation film 1041 is a Ti film, the second separation film 1042 is an Al film, and the third separation film 1043 is another Ti film.

The first separation film 1041 is in contact with the active pattern 144 in the pixel region 101 through the first via hole 1531 and the second via hole 1532.

In S504, as shown in FIG. 11B and FIG. 16, the source 142 and the drain 143 are formed in the pixel region 101, by performing a dry etching on the first separation film 1041, the second separation film 1042 and the third separation film 1043.

The source 142 and the drain 143 and the separation pillar transition structure 104 have a three-layer structure. The source 142 and the drain 143 are in contact with the active layer 144 through the first via hole 1531 and the second via hole 1532, respectively.

Since the separation pillar transition structure 104 and the top-gate TFT are formed simultaneously, the manufacturing process of the display panel 1 may be simplified.

In an example where the TFT 14 is a bottom-gate TFT, and the source 142 and the drain 143 of the TFT 14 have a three-layer structure, the method of forming the TFT 14 and the separation pillar transition structure 104 include step 601 (S601) to step 603 (S603).

Figure 17:
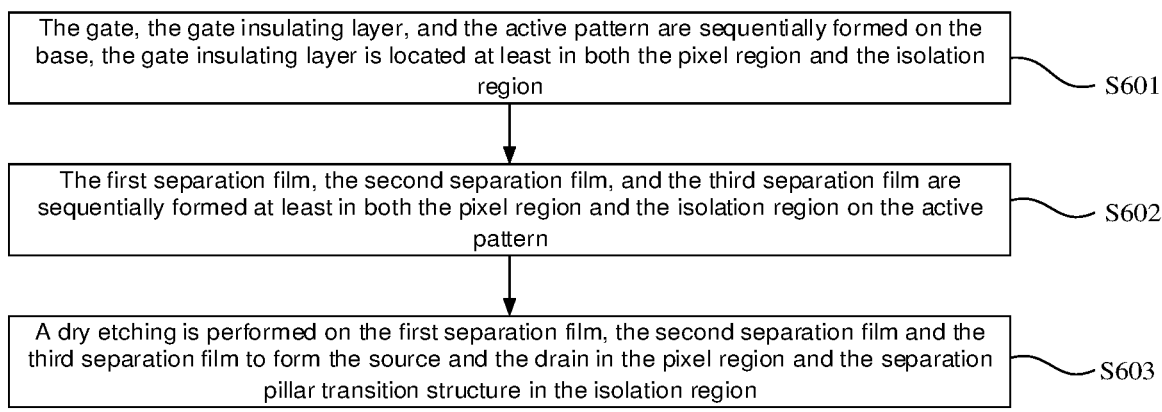
FIG. 17 is a flowchart of yet another method of manufacturing a display panel, according to some embodiments.

In S601, as shown in FIG. 2D and FIG. 17, the gate 141, the gate insulating layer 145, and the active pattern 144 are sequentially formed on the base 13. The gate insulating layer 145 is located at least in both the pixel region 101 and the isolation region 103.

In some embodiments, the gate insulating layer 145 includes a plurality of first grooves 151 located in the isolation region 103.

In some examples, the gate 141 and a gate insulating film are formed first, and after the gate insulating film is etched to form a gate insulating layer 145 including the first groove 151, the active pattern 144 is formed.

In some other examples, the gate 141, the gate insulating film and the active film may be formed first, and then the gate insulating film and the active film are patterned with a half-tone mask to form the active pattern 144 and the gate insulating layer 145 including the first groove 151. Herein, a photoresist is formed on the active film. A half-tone mask is used to expose the photoresist to form a photoresist removal portion corresponding to the first groove to be formed, a photoresist completely residual portion corresponding to the active pattern to be formed, and a photoresist semi-residual portion corresponding to other positions. The first groove 151 located in the gate insulating film at the position corresponding to the photoresist removal portion is formed through an etching process, and then an ashing is performed on the photoresist for removing the photoresist in the photoresist semi-residual portion, and thinning the photoresist in the photoresist completely residual portion. Then, a portion of the active film corresponding to the photoresist semi-residual portion is removed through an etching process, so that a portion of the active film corresponding to the photoresist completely residual portion forms the active pattern 144. Finally, the remaining photoresist is removed.

In S602, as shown in FIG. 17, the first separation film 1041, the second separation film 1042, and the third separation film 1043 are sequentially formed at least in both the pixel region 101 and the isolation region 103 on the active pattern 144.

For example, the first separation film 1041, the second separation film 1042, and the third separation film 1043 may be formed through the magnetron sputtering process. For example, the first separation film 1041 is a Ti film, the second separation film 1042 is an Al film, and the third separation film 1043 is another Ti film.

The first separation film 1041 is in direct contact with the active pattern 144 in the pixel region 101.

In S603, as shown in FIG. 17, a dry etching is performed on the first separation film 1041, the second separation film 1042 and the third separation film 1043 to form the source 142 and the drain 143 in the pixel region 101 and the separation pillar transition structure 104 in the isolation region 103.

The source 142 and the drain 143 have a same three-layer structure as the separation pillar transition structure 104.

Since the separation pillar transition structure 104 and both the source 142 and the drain 143 are formed simultaneously, the manufacturing process of the display panel 1 may be simplified.

In some embodiments, the S12, in which the protection pattern 1035 is formed on the surface of the separation pillar transition structure 104 facing away from the base 13, further include step 201 (S201) and step 202 (S202).

Figure 11C:
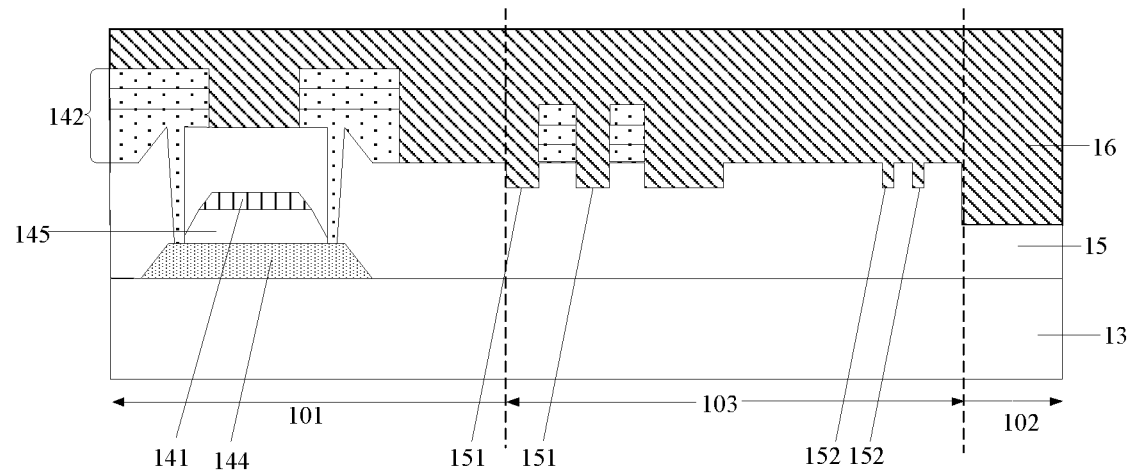
FIG. 11C is a schematic diagram showing a process of forming a planarization film, according to some embodiments.
Figure 18:
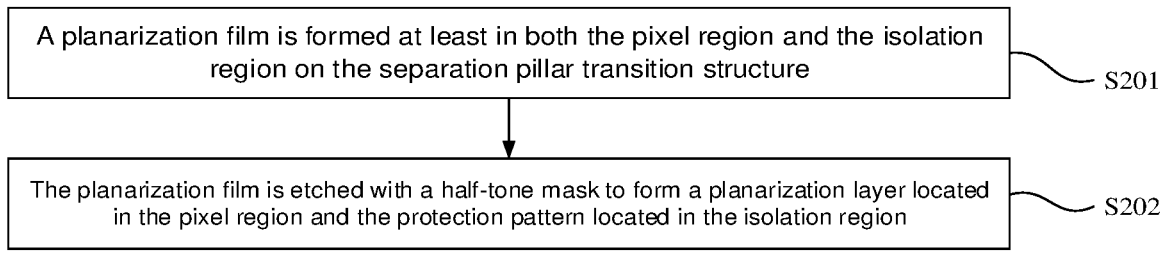
FIG. 18 is a flowchart of yet another method of manufacturing a display panel, according to some embodiments.

In S201, as shown in FIG. 11C and FIG. 18, a planarization film 16 formed at least in both the pixel region 101 and the isolation region 103 on the separation pillar transition structure 104.

Figure 11D:
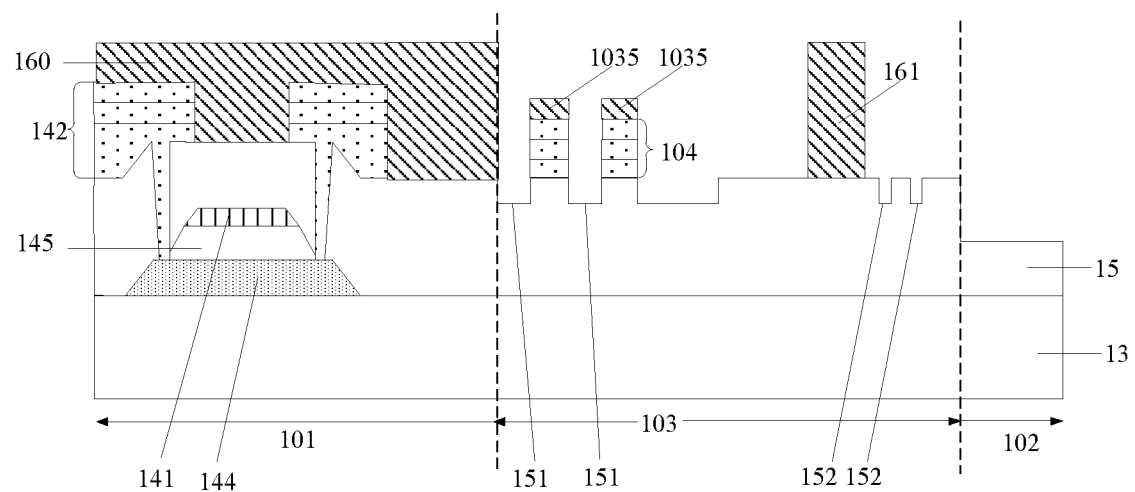
FIG. 11D is a schematic diagram showing a process of forming a planarization layer, a protection pattern and a raised portion, according to some embodiments.

In S202, as shown in FIG. 11D and FIG. 18, the planarization film 16 is etched with a half-tone mask to form a planarization layer 160 located in the pixel region 101 and the protection pattern 1035 located in the isolation region 103.

The thickness of the planarization layer 160 is greater than the thickness of the protection pattern 1035. For example, the thickness of the protection pattern 1035 is approximately 10 nm to approximately 50 nm, and the thickness of the planarization layer 160 is approximately 50 nm to approximately 100 nm.

In an example where the material of the planarization film 16 is photosensitive polyimide, the process of etching the planarization film 16 with a half-tone mask includes: exposing the polyimide film with a half-tone mask; forming a polyimide completely residual portion, a polyimide semi-residual portion, and a polyimide complete removal portion after a development process. The polyimide completely residual portion is the planarization layer 160 in the pixel region 101, the polyimide semi-residual portion is the protection pattern 1035 in the isolation region 103, and the polyimide complete removal portion corresponds to other portions. Other portions include, for example, a portion between the planarization layer 160 and the separation pillar 1031, a portion between two adjacent separation pillars 1031, and a portion between the separation pillar 1031 and a first barrier 1036 (to be described later).

Herein, the half-tone mask may make the photoresist type material be exposed incompletely by utilizing partial light transmittance of the grating. The light transmission amount of the half-tone mask may be determined according to the required height of the film, and thus the half-tone mask may be used to form the planarization layer 160 and the protection pattern 1035 with different thicknesses.

By making the thickness of the protection pattern 1035 smaller, the overall thickness of the protection pattern 1035 and the separation pillar 1031 may not be too large, which may improve the yield of the light-emitting functional layer 1014 and other layers located on the light-emitting functional layer 1014 that are to be formed.

In some embodiments, as shown in FIG. 11D, while the planarization layer 160 is formed, the raised portion 161 may be simultaneously formed in the isolation region 103.

Figure 13A:
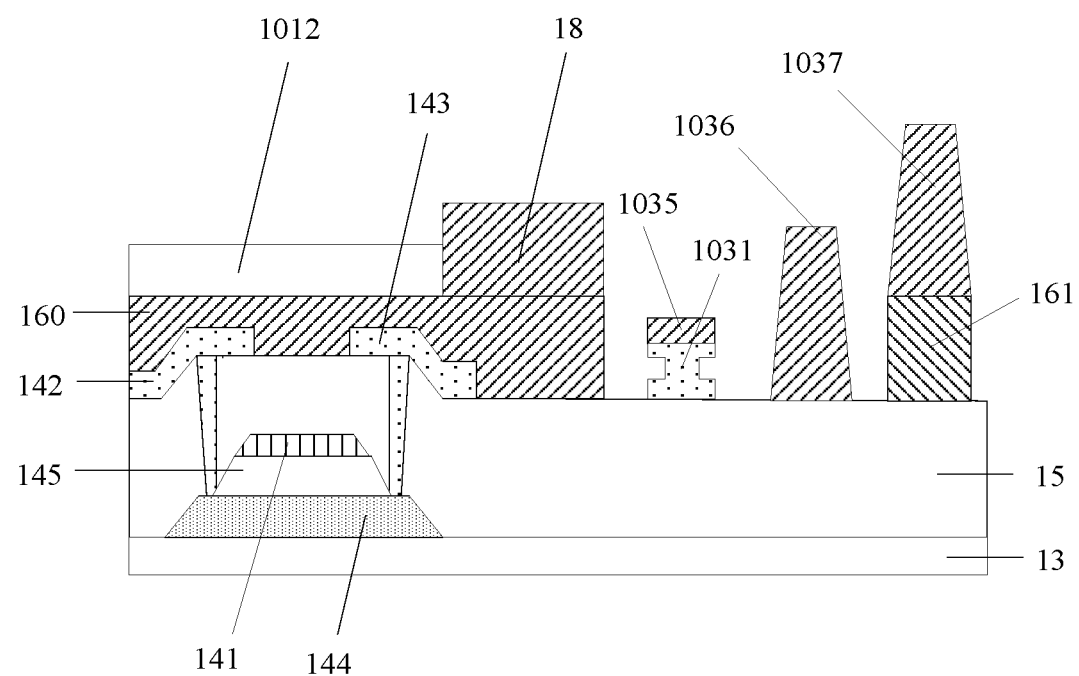
FIG. 13A is a schematic diagram showing a process of forming an anode, a pixel defining structure, a first barrier and a second barrier, according to some embodiments.

After forming the planarization layer 160, the protection pattern 1035 and the raised portion 161, the method of manufacturing the display panel 1 further includes: as shown in FIG. 13A, forming an anode 1012 in the pixel region 101. The anode 1012 may be electrically connected to the drain 143 through the third via hole 162 passing through the planarization layer 160.

In some embodiments, as shown in FIG. 13A, the pixel defining structure 18, the first barrier 1036 and the second barrier 1037 are formed on the base 13 on which the anode 1012 has been formed. The pixel defining structure 18 is located in the pixel region 101, and the first barrier 1036 and the second barrier 1037 are located in the isolation region 103. The pixel defining structure 18, the first barrier 1036 and the second barrier 1037 are formed through the same patterning process. Both the first barrier 1036 and the second barrier 1037 are disposed around the opening region 102. The first barrier 1036 is located between the opening region 102 and the at least one separation pillar 1031. The second barrier 1037 is located between the first barrier 1036 and the opening region 102. The first barrier 1036 is formed on the insulating layer (for example, the interlayer insulating layer 15), and the second barrier 1037 is formed on the raised portion 161.

On this basis, the raised portion 161 and the planarization layer 160 may be formed synchronously, which may simplify the process of forming the raised portion 161. The raised portion 161 can support the second barrier 1037, so that in the thickness direction of the base 13, the distance from the surface of the first barrier 1036 facing away from the base 13 to the base 13 is less than a distance from the surface of the second barrier 1037 facing away from the base 13 to the base 13. Therefore, after the organic material is intercepted by the first barrier 1036, the second barrier 1037 may further intercept the organic material, which may avoid the problem of the organic material spreading to the opening region 102 due to the insufficient interception of the first barrier 1036.

In some embodiments, as shown in FIG. 12, the method of manufacturing the display panel 1 further includes: forming at least one second groove 152 in the insulating layer. The at least one second groove 152 is located between the opening region 102 and both the second barrier 1037 and the raised portion 161. In some examples, a depth of the second groove 152 is less than the thickness of the insulating layer. In some other examples, the second groove 152 passes through the insulating layer in the thickness direction of the insulating layer. That is, the second groove 152 is a via hole passing through the insulating layer.

As shown in FIGS. 11A to 11D, the second groove 152 and the first groove 151 may be formed simultaneously. By providing the second groove 152 between the second barrier 1037 and the opening region 102, it is possible to prevent cracks generated in forming the opening in the opening region 102 from spreading to the pixel region 101.

With regard to the arrangement manner of the first groove 151 and the second groove 152, reference may be made to corresponding structure of the display panel described above, which will not be described in detail herein.

Figure 13B:
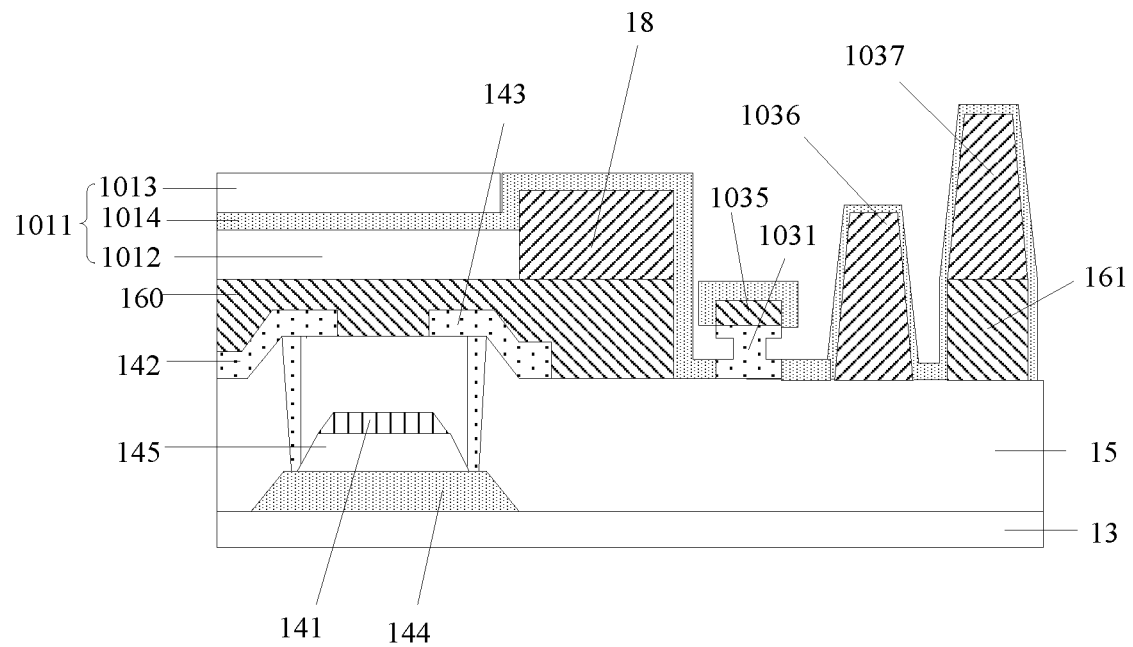
FIG. 13B is a schematic diagram showing a process of manufacturing a light-emitting device, according to some embodiments.

After forming the light-emitting functional layer 1014, the method of manufacturing the display panel 1 further includes: as shown in FIG. 13B, forming a cathode 1013 on the base 13 on which the light-emitting functional layer 1014 has been formed.

For example, the cathode 1013 is formed at least in both the pixel region 101 and the isolation region 103. The cathode 1013 has a tiled integrated structure. On this basis, the cathode 1013 is disconnected on side faces of the separation pillar 1031.

The anode 1012, a portion of the light-emitting function layer 1014 and a portion of the cathode 1013 located in each sub-pixel region 1010 constitute the light-emitting device 1011.

The anode 1012 and the portion of the cathode 1013 in the light-emitting device 1011 are used to provide an electric field to the portion of the light-emitting functional layer 1014, so that the light-emitting layer 1015 of the light-emitting functional layer 1014 emits light under the act of the electric field.

As shown in FIGS. 2A to 2D, after the cathode 1013 is formed, the method of manufacturing the display panel 1 may further include: forming the first inorganic encapsulation layer 19, the organic encapsulation layer 20, and the second inorganic encapsulation layer 21 sequentially.

For example, the first inorganic encapsulation layer 19 and the second inorganic encapsulation layer 21 may be formed through the low-temperature vapor deposition and other steps, and the organic encapsulation layer 20 may be formed through inkjet printing and other steps.

The forgoing descriptions are merely specific implementation manners of the present disclosure, but the protection scope of the present disclosure is not limited thereto. Any person skilled in the art could readily conceive of changes or replacements within the technical scope of the present disclosure, which shall all be included in the protection scope of the present disclosure. Therefore, the protection scope of the present disclosure shall be subject to the protection scope of the claims.

What is claimed is:

1. A display panel, having a display area, the display area including a pixel region, an opening region and an isolation region disposed between the pixel region and the opening region, the isolation region being disposed around the opening region, and the display panel comprising:
   a base;
   at least one separation pillar disposed in the isolation region on the base, each separation pillar being disposed around the opening region, and a longitudinal section of the separation pillar perpendicular to an extending direction of the separation pillar being I-shaped;
   at least one protection pattern disposed on a surface of at least one separation pillar facing away from the base; and
   a light-emitting functional layer disposed at least in both the pixel region and the isolation region on a surface of the at least one protection pattern facing away from the base, wherein the light-emitting functional layer is disconnected at an inner side face and an outer side face of the separation pillar; wherein
   a material of the at least one protection pattern includes an organic resin, and a thickness of each protection pattern is in a range of approximately 10 nm to approximately 100 nm.

2. The display panel according to claim 1, wherein an orthographic projection of the separation pillar on the base is within a range of an orthographic projection of a corresponding protection pattern on the base.

3. The display panel according to claim 1, wherein in a thickness direction of the base, the separation pillar includes a first separation portion, a second separation portion, and a third separation portion that are sequentially stacked; compared with a side face of the first separation portion proximate to a central axis of the separation pillar and a side face of the third separation portion proximate to the central axis of the separation pillar, a side face of the second separation portion proximate to the central axis of the separation pillar is furthest away from the central axis of the separation pillar, and compared with a side face of the first separation portion away from the central axis of the separation pillar and a side face of the third separation portion away from the central axis of the separation pillar, another side face of the second separation portion away from the central axis of the separation pillar is closest to the central axis of the separation pillar; wherein the central axis of the separation pillar is a central axis of rings shaped by the first separation portion, the second separation portion and the third separation portion; and a material of the first separation portion is the same as a material of the third separation portion, a material of the second separation portion is different from the material of the third separation portion, and an etch rate of the material of the second separation portion is greater than an etch rate of the material of the third separation portion.

4. The display panel according to claim 3, further comprising:
   an insulating layer, the at least one separation pillar being disposed on a first surface of the insulating layer facing away from the base; and
   at least one first groove disposed in the isolation region in the first surface of the insulating layer, each first groove being disposed around the opening region, wherein
   the at least one first groove includes one first groove, the one first groove is disposed on a side of the at least one separation pillar proximate to or away from the opening region, and a side wall of the one first groove proximate to the at least one separation pillar and a side face of a first separation portion of a separation pillar closest to the one first groove are in or substantially in a same plane or a same curved surface; or
   the at least one first groove includes a plurality of first grooves, two first grooves are disposed on both sides of each separation pillar, respectively, and a side wall of each first groove proximate to the separation pillar and a side face of a first separation portion of the separation pillar proximate to the first groove are in or substantially in a same plane or a same curved surface.

5. The display panel according to claim 4, wherein the pixel region includes a plurality of sub-pixel regions, the display panel further comprises a plurality of driving circuits disposed between the base and the light-emitting functional layer, and each driving circuit is disposed in a corresponding sub-pixel region;
   the driving circuit includes a plurality of thin film transistors, each thin film transistor includes a gate, a source and a drain, and the source and the drain are disposed on a side of the gate away from the base; and
   the source and the drain have a three-layer structure, and the at least one separation pillar is disposed in same layers as the source and the drain.

6. The display panel according to claim 5, wherein the thin film transistor further includes an active pattern and a portion of the insulating layer located between the gate and the active pattern;
   the active pattern is disposed on a side of the gate proximate to the base, the insulating layer is disposed between the gate and both the source and the drain, and the source and the drain are in contact with the active pattern through a first via hole and a second via hole passing through at least the insulating layer, respectively; or
   the active pattern is disposed on a side of the gate away from the base, the source and the drain are directly disposed on the active pattern, and the insulating layer is a gate insulating layer.

7. The display panel according to claim 5, further comprising a planarization layer disposed between the driving circuit and the light-emitting functional layer, wherein
   the planarization layer is disposed in the pixel region; the planarization layer and the at least one protection pattern are disposed in a same layer, and a thickness of the planarization layer is greater than a thickness of each protection pattern.

8. The display panel according to claim 4, further comprising a first barrier and a second barrier that are located in the isolation region and disposed around the opening region, wherein the first barrier and the second barrier are disposed between the at least one separation pillar and the opening region, and the second barrier is disposed between the first barrier and the opening region; and in the thickness direction of the base, a distance from a surface of the first barrier facing away from the base to a surface of the base facing the first barrier is less than a distance from a surface of the second barrier facing away from the base to the surface of the base.

9. The display panel according to claim 8, further comprising:

a raised portion disposed on a surface of the second barrier proximate to the base; and a pixel defining structure disposed in the pixel region and located between adjacent sub-pixel regions, wherein the first barrier, the second barrier and the pixel defining structure are disposed in a same layer, and the raised portion and the at least one protection pattern are disposed in a same layer.

10. The display panel according to claim 9, wherein at least one second groove is disposed in the isolation region in the first surface of the insulating layer, and the at least one second groove is disposed between the second barrier and the opening region.

11. The display panel according to claim 1, wherein the at least one separation pillar includes two separation pillars spaced apart.

12. The display panel according to claim 1, further comprising a cathode disposed on a surface of the light-emitting functional layer facing away from the base, wherein the cathode is located at least in both the pixel region and the isolation region, and is disconnected at the inner side face and the outer side face of the separation pillar.

13. A display apparatus, comprising the display panel according to claim 1.

14. A method of manufacturing the display panel according to claim 1, the method comprising:

forming at least one separation pillar transition structure in the isolation region on the base through a dry etching process, each separation pillar transition structure being disposed around the opening region;

forming the at least one protection pattern on a surface of at least one separation pillar transition structure facing away from the base;

performing a wet etching on the at least one separation pillar transition structure on which the at least one protection pattern has been formed to form the at least one separation pillar, and the longitudinal section of the separation pillar being I-shaped; and forming the light-emitting functional layer at least in both the pixel region and the isolation region on the base on which the at least one separation pillar has been formed, the light-emitting functional layer being disconnected at the inner side face and the outer side face of the separation pillar.

15. The method according to claim 14, wherein forming the at least one separation pillar transition structure in the isolation region on the base through the dry etching process, includes:

forming a first separation film, a second separation film and a third separation film sequentially on the base, a material of the first separation film being the same as a material of the third separation film, a material of the second separation film being different from the material of the third separation film, and an etch rate of the material of the third separation film being less than an etch rate of the material of the second separation film; and etching the first separation film, the second separation film, and the third separation film through the dry etching process to form the at least one separation pillar transition structure in the isolation region, each separation pillar transition structure including a first separation pattern, a second separation pattern, and a third separation pattern.

16. The method according to claim 14, wherein before forming the at least one separation pillar transition structure in the isolation region on the base through the dry etching process, the method further comprises:

forming an insulating layer on the base;

forming one first groove in the isolation region in the insulating layer, the one first groove being disposed around the opening region, wherein each separation pillar transition structure is formed on a side of a first groove proximate to or facing away from the opening region, and a side face of the first groove proximate to the separation pillar transition structure and a side face of the separation pillar transition structure proximate to the first groove are in or substantially in a same plane or a same curved surface;

or forming at least two first grooves in the isolation region in the insulating layer, the at least two first grooves being disposed around the opening region, wherein each separation pillar transition structure is formed between two adjacent first grooves, and a side face of each first groove proximate to the separation pillar transition structure and a side face of the separation pillar transition structure proximate to the first groove are in or substantially in a same plane or a same curved surface.

17. The method according to claim 14, wherein the pixel region includes a plurality of sub-pixel regions; and before forming the light-emitting functional layer at least in both the pixel region and the isolation region on the base on which the at least one separation pillar has been formed, the method further comprises:

forming a driving circuit in each sub-pixel region on the base, wherein the driving circuit includes a plurality of thin film transistors, each thin film transistor includes a gate, a source and a drain, and the source and the drain are disposed on a side of the gate away from the base; the source and the drain have a three-layer structure, and the at least one separation pillar transition structure is formed through a same patterning process as the source and the drain.

18. The method according to claim 17, wherein forming a driving circuit in each sub-pixel region on the base includes:

forming an active pattern, a gate insulating block and a gate on the base, an area of an orthographic projection of the gate insulating block on the base being less than an area of an orthographic projection of the active pattern on the base;

forming an interlayer insulating layer on the gate, the interlayer insulating layer having a first via hole and a second via hole passing therethrough to expose a portion of the active pattern;

forming a first separation film, a second separation film, and a third separation film sequentially on the interlayer insulating layer, the first separation film, the second separation film and the third separation film being located in both the pixel region and the isolation region; and performing a dry etching on the first separation film, the second separation film, and the third separation film to form the source and the drain in the pixel region, the source and the drain being in contact with the active pattern through the first via hole and the second via hole, respectively.

19. The method according to claim 17, wherein forming the at least one protection pattern on the surface of the at least one separation pillar transition structure facing away from the base, includes:

forming a planarization film at least in both the pixel region and the isolation region on the surface of the at least one separation pillar transition structure facing away from the base; and etching the planarization film with a half-tone mask to form a planarization layer in the pixel region and the at least one protection pattern located in the isolation region; a thickness of the planarization layer being greater than a thickness of each protection pattern.

* * * * *